(12) United States Patent
Hanzawa

(10) Patent No.: US 10,777,611 B1
(45) Date of Patent: Sep. 15, 2020

(54) IMAGE SENSOR

(71) Applicant: SONY SEMICONDUCTOR SOLUTIONS CORPORATION, Kanagawa (JP)

(72) Inventor: Katsuhiko Hanzawa, Fukushima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/779,408

(22) Filed: Jan. 31, 2020

Related U.S. Application Data

(60) Provisional application No. 62/907,170, filed on Sep. 27, 2019.

(51) Int. Cl.
*H01L 27/30* (2006.01)
*H01L 51/44* (2006.01)

(52) U.S. Cl.
CPC ............ *H01L 27/307* (2013.01); *H01L 51/44* (2013.01)

(58) Field of Classification Search
None
See application file for complete search history.

(56) References Cited

U.S. PATENT DOCUMENTS

| | | | |
|---|---|---|---|
| 2007/0009223 A1* | 1/2007 | Rudmann | H01L 25/167 385/147 |
| 2015/0206921 A1* | 7/2015 | Imoto | H01L 27/14654 257/230 |
| 2020/0075643 A1* | 3/2020 | Han | H01L 27/14636 |
| 2020/0075678 A1* | 3/2020 | Rodriquez | H01L 51/4253 |

FOREIGN PATENT DOCUMENTS

JP 2007-281144 10/2007

* cited by examiner

*Primary Examiner* — Evren Seven
(74) *Attorney, Agent, or Firm* — Sheridan Ross P.C.

(57) ABSTRACT

To provide an imaging device that is able to have both excellent pixel characteristics and a great power generation amount. An imaging device according to an embodiment of the present disclosure includes: a semiconductor substrate that includes one surface to be a light entering surface and another surface opposed to the one surface; an imaging unit that is provided in the semiconductor substrate and includes a plurality of sensor pixels that performs photoelectric conversion; and an electric power generating unit that is provided around the imaging unit of the semiconductor substrate and performs photoelectric conversion.

20 Claims, 31 Drawing Sheets

IMAGE SENSOR

CROSS REFERENCE TO RELATED APPLICATIONS

This application is continuation application under 35 U.S.C. 371 and claims the benefit of U.S. Provisional Application No. 62/907,170 filing date of Sep. 27, 2019, the entire disclosure of which is incorporated herein by reference.

TECHNICAL FIELD

The present disclosure relates to an imaging device that includes an imaging unit and an electric power generating unit.

BACKGROUND ART

As a technology for Internet of Things (IoT), a battery driving technique with no power supply is desired. For example, PTL 1 discloses a solid imaging device in which a solar battery that receives light taken from an imaging lens is provided between arranged light receiving cells.

CITATION LIST

Patent Literature

PTL 1: Japanese Unexamined Patent Application Publication No. 2007-281144

SUMMARY OF THE INVENTION

Problems to be Solved by the Invention

Incidentally, the imaging device including the solar battery as described above is desired to have both excellent pixel characteristics and a great power generation amount.

It is desirable to provide an imaging device that is able to have both excellent pixel characteristics and a great power generation amount.

Means for Solving the Problems

An imaging device according to an embodiment of the present disclosure includes a semiconductor substrate, an imaging unit, and an electric power generating unit. The semiconductor substrate includes one surface and another surface that are opposed to each other. The imaging unit is provided in the semiconductor substrate and includes a plurality of sensor pixels that performs photoelectric conversion. The electric power generating unit is provided around the imaging unit of the semiconductor substrate and performs photoelectric conversion.

In the imaging device according to an embodiment of the present disclosure, by providing the electric power generating unit that performs photoelectric conversion on the semiconductor substrate around the imaging unit including the plurality of sensor pixels, the electric power generating unit is disposed without reducing the number or an area of the sensor pixels configuring the imaging unit or without increasing an area of the semiconductor substrate.

BRIEF DESCRIPTION OF DRAWINGS

FIG. 24 is a block diagram illustrating an overall configuration of the imaging device illustrated in FIG. 1 or the like.

FIG. 25 is a functional block diagram illustrating an example of an imaging apparatus (camera) using the imaging device illustrated in FIG. 1 or the like.

MODES FOR CARRYING OUT THE INVENTION

Figure 1:
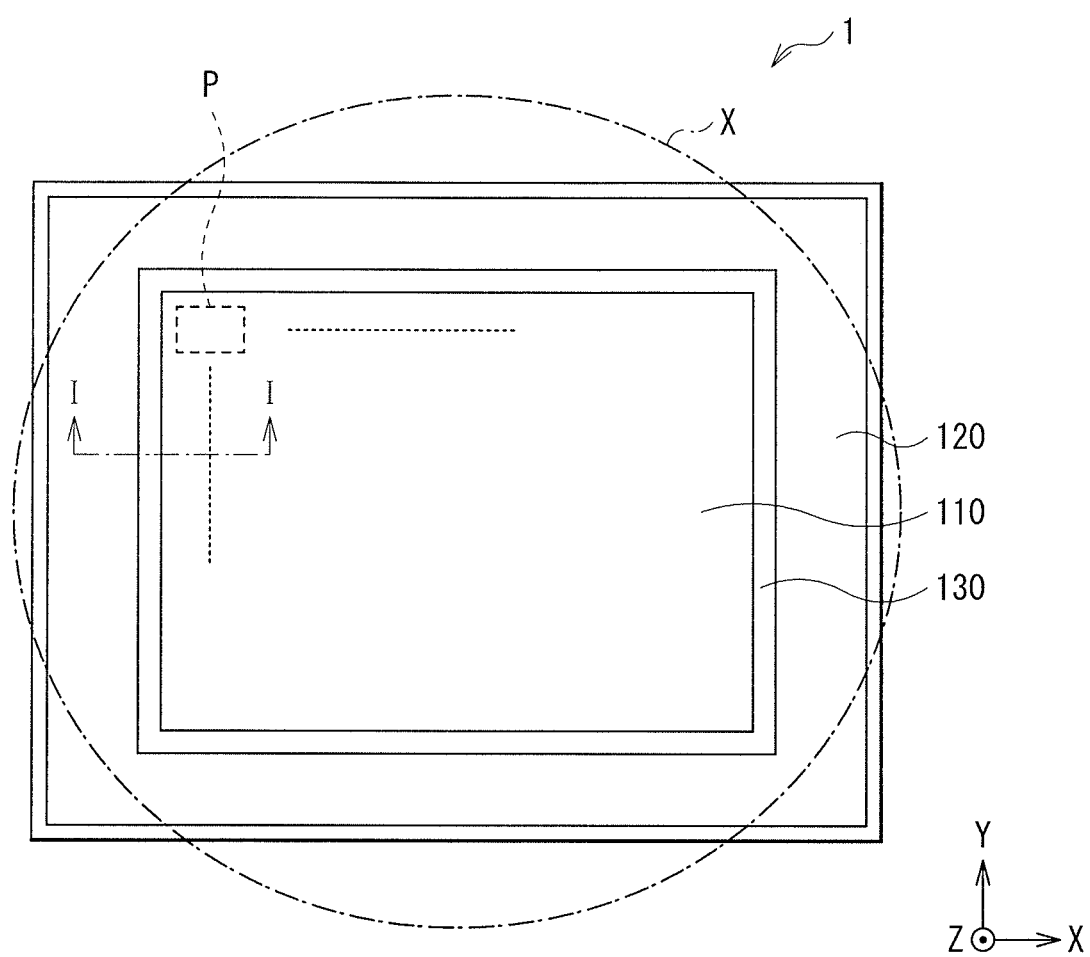
FIG. 1 is a schematic plan view illustrating an outline configuration of an imaging device according to a first embodiment of the present disclosure.
Figure 2:
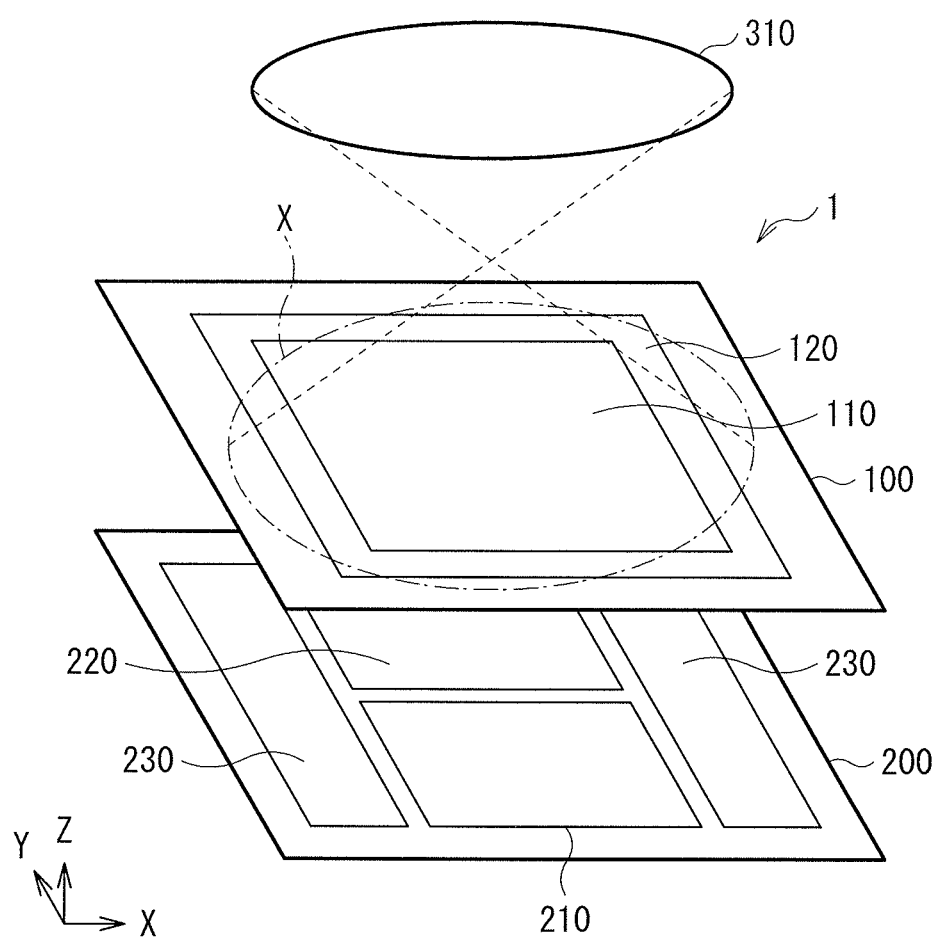
FIG. 2 is a diagram illustrating a laminated configuration of the imaging device illustrated in FIG. 1.
Figure 3:
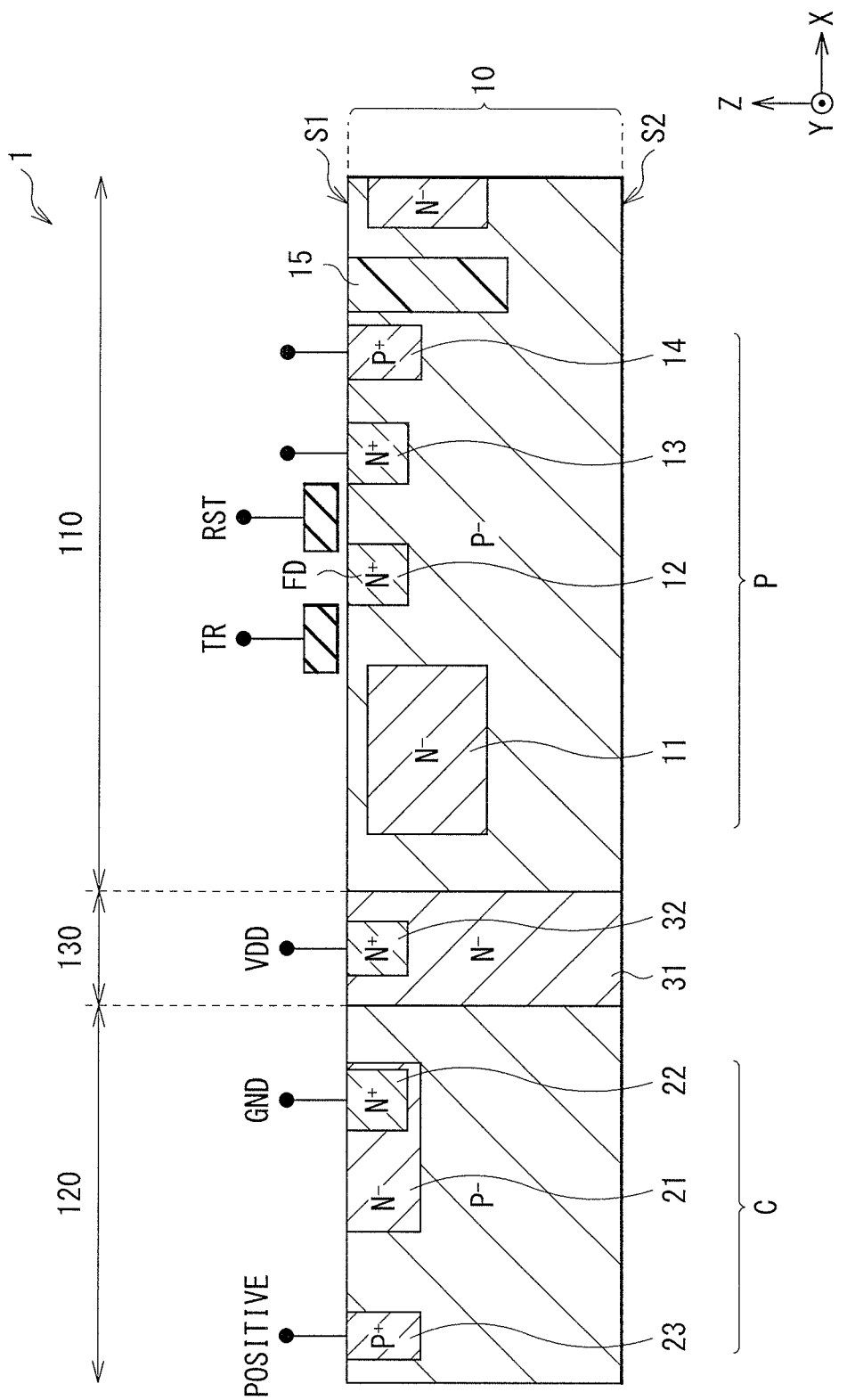
FIG. 3 is a schematic cross-sectional diagram illustrating an example of a configuration taken along a line I-I of the imaging device illustrated in FIG. 1.
Figure 4:
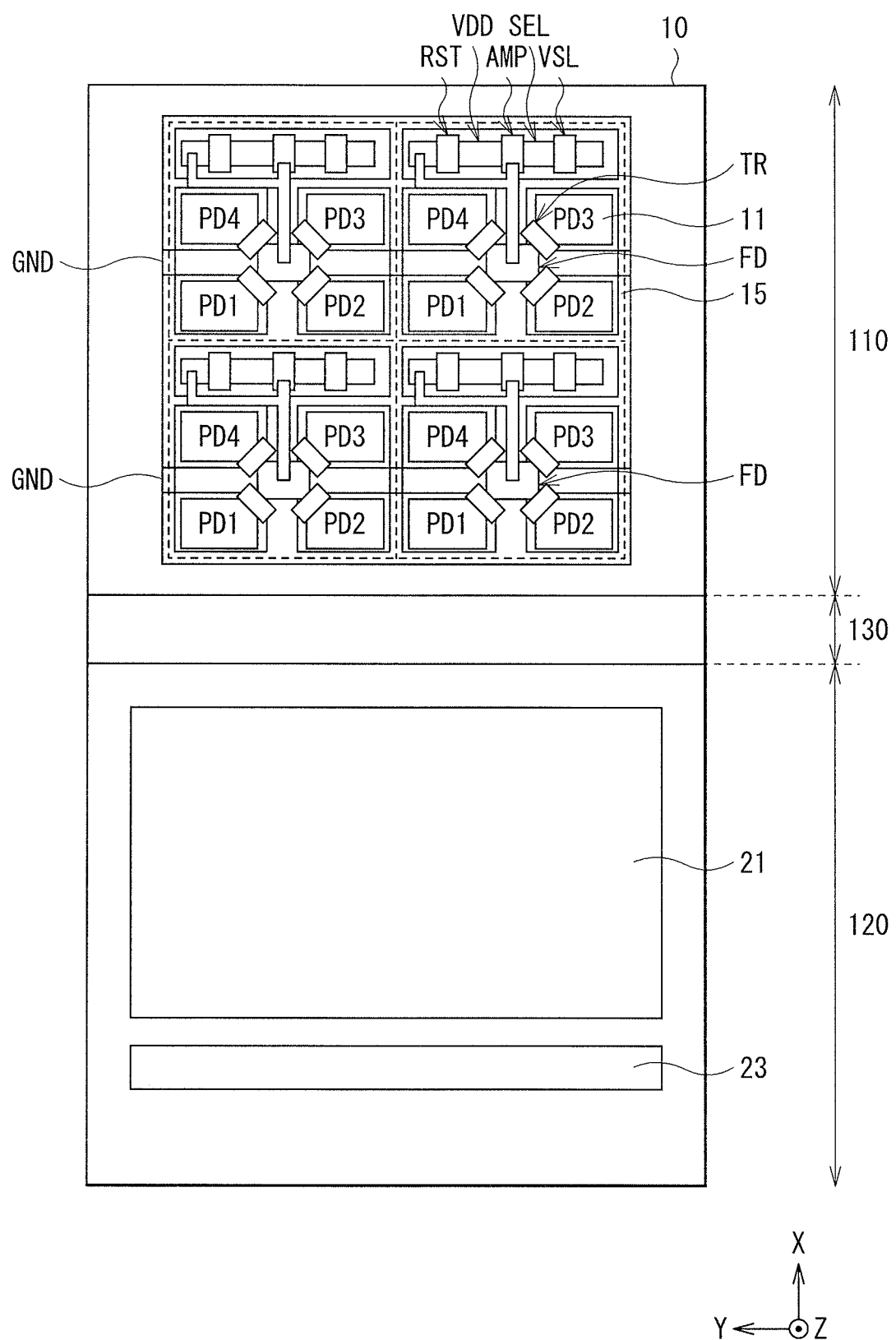
FIG. 4 is a plan view illustrating a specific example of a configuration taken along the line I-I of the imaging device illustrated in FIG. 1 and vicinity thereof.

An embodiment according to the present disclosure will be described below in detail with reference to the drawings. The following description is a specific example of the present disclosure, and the present disclosure is not limited to the following embodiments. Furthermore, regarding arrangement, dimensions, a dimensional ratio, and the like, the present disclosure is not limited to those of the components illustrated in the drawings. Note that the description will be made in the following order.
1. First Embodiment (An example of an imaging device that includes an electric power generating unit around an imaging unit)
   1-1. Configuration of Imaging Device
   1-2. Operation of Imaging Device
   1-3. Workings and Effects
2. Second Embodiment (An example in which a sensor pixel of an imaging unit and a solar cell of an electric power generating unit have the same structure)
3. Third Embodiment (An example in which an electric power generating unit includes a multistage solar cell)
4. Modification Examples
   4-1. Modification Example 1 (Another example of a shape of a photoelectric conversion unit configuring a solar cell)
   4-2. Modification Example 2 (An example of a front-side illuminated imaging device)
   4-3. Modification Example 3 (An example in which a light entering surface of a semiconductor substrate has an uneven structure)
   4-4. Modification Example 4 (An example in which a photoelectric conversion unit configuring a sensor pixel is provided outside a semiconductor substrate)
5. Application Examples
6. Applied Examples 1. First Embodiment FIG. 1 is a plan view schematically illustrating an outline configuration of an imaging device (an imaging device 1) according to a first embodiment of the present disclosure. FIG. 2 illustrates a laminated configuration of the imaging device illustrated in FIG. 1. FIG. 3 schematically illustrates an example of a cross-sectional configuration of the imaging device 1 taken along a line I-I illustrated in FIG. 1. FIG. 4 schematically illustrates a specific example of a planar configuration along the line I-I illustrated in FIG. 1 and the vicinity thereof and illustrates an example, for example, in which four pixels P arranged in two rows and two columns supply a single pixel circuit. The imaging device 1 according to the present embodiment is a CCD image sensor or a CMOS image sensor having a battery driving technique with no power supply. The imaging device 1 according to the present embodiment has a configuration in which an electric power generating unit 120 including one or a plurality of solar cells C is provided around an imaging unit 110 including a plurality of sensor pixels (simply referred to as a pixel P below).

1-1. Configuration of Imaging Device

The imaging device 1 includes, for example, two substrates (a first substrate 100 and a second substrate 200). The imaging device 1 is an imaging device having a three-dimensional structure configured by bonding the first substrate 100 and the second substrate 200 to each other. In the first substrate 100, for example, the imaging unit 110 and the electric power generating unit 120 are provided on a semiconductor substrate 10. On the second substrate 200, for example, a peripheral circuit 210 as a logic circuit, a column ADC 220, a controller 230, and the like are provided. The imaging device 1 is, for example, a rear-side illuminated imaging device. An optical system 310 to be described later is disposed above the imaging device 1, specifically, on rear surface side of the first substrate 100, and light enters from the rear surface side of the first substrate 100 through the optical system 310.

The imaging unit 110 and the electric power generating unit 120 will be described below. Note that, in the present embodiment, a case will be described where an electron out of a pair of an electron and a hole generated by a photoelectric conversion unit is read as a signal charge (a case where an n-type semiconductor region (N−) is used as a photoelectric conversion unit). Furthermore, in the drawings, "+(plus)" applied to "P" and "N" indicates that a p-type or n-type impurity concentration is higher than that in a surrounding p-type semiconductor region or n-type semiconductor region, and "− (minus)" indicates that the p-type or n-type impurity concentration is lower than that in the surrounding p-type semiconductor region or n-type semiconductor region.

As illustrated in FIG. 1, both of the imaging unit 110 and the electric power generating unit 120 according to the present embodiment are provided, for example, in an image circle X, and the electric power generating unit 120 is provided around the imaging unit 110. Here, the "image circle" indicates a circular range where light that has passed through the optical system 310 forms an image on a light entering surface (specifically, the rear surface (a surface S2) of the semiconductor substrate 10) of the imaging device 1. Note that, the "circular" includes a precise circle and an ellipse. The imaging unit 110 and the electric power generating unit 120 are electrically isolated from each other by an isolator 130.

(Imaging Unit)

The imaging unit 110 detects light in a predetermined wavelength band and performs photoelectric conversion. In the imaging unit 110, the plurality of pixels P is arranged in a two-dimensional array. In the imaging unit 110, a photodiode (PD) is formed and embedded in the semiconductor substrate 10 as a photoelectric conversion unit 11 for each pixel P. A floating diffusion FD is provided on a surface (a surface S1) of the semiconductor substrate 10. Furthermore, various transistors configuring the pixel circuit are formed near the surface S1 of the semiconductor substrate 10.

The semiconductor substrate 10 includes, for example, a p-type silicon (Si) substrate whose impurity concentration is equal to or more than $1\times10^{14}/cm^2$ and equal to or less than $1\times10^{20}/cm^2$. The semiconductor substrate 10 has an n-type semiconductor region (N−) configuring the photodiode PD to be the photoelectric conversion unit 11 in a predetermined region.

Figure 5:
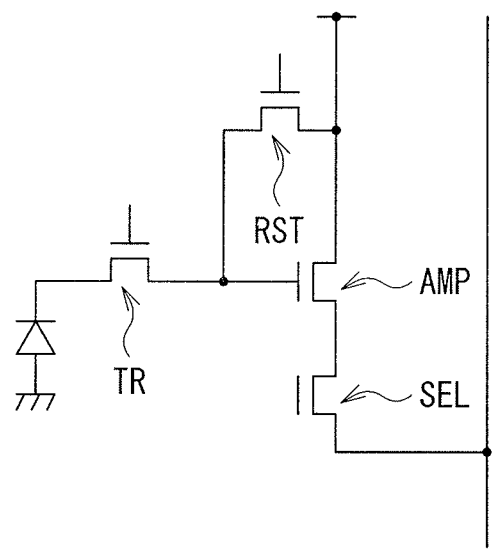
FIG. 5 is an equivalent circuit diagram of a pixel illustrated in FIG. 1.

A transfer transistor TR that transfers a signal charge generated by the photoelectric conversion unit 11 to, for example, a vertical signal line Lsig (refer to FIG. 24) as a pixel transistor is provided near the surface S1 of the semiconductor substrate 10. The signal charge may be any one of an electron and a hole generated by photoelectric conversion. However, here, a case where the electron is read as the signal charge will be described as an example. For example, a reset transistor RST, an amplification transistor AMP, a selection transistor SEL, and the like are provided near the surface S1 of the semiconductor substrate 10 together with the transfer transistor TR. Such a transistor is, for example, a MOSFET (Metal Oxide Semiconductor Field Effect Transistor) and has the pixel circuit, for example, illustrated in FIG. 5, for example, for each pixel P or for each group of four pixels P arranged in two rows and two columns as illustrated in FIG. 4. The pixel circuit may have, for example, a three-transistor configuration including the transfer transistor TR, the reset transistor RST, and the amplification transistor AMP or may have a four-transistor configuration in which the selection transistor SEL is added to the three-transistor configuration.

The photoelectric conversion unit 11 is a p-n junction type photodiode PD including, for example, an n-type semiconductor region (N−), formed and embedded in the semiconductor substrate 10 for each pixel P. The photoelectric conversion unit 11 generates charges in accordance with an amount of the light entered by the photoelectric conversion, on the basis of the entering light and accumulates the generated charges. In the photodiode PD, a cathode is electrically coupled to a source of the transfer transistor TR, and an anode is electrically coupled to a reference potential line (for example, ground GND).

The transfer transistor TR operates on the basis of, for example, a transfer signal supplied from the controller 230 via a transfer signal line at a predetermined timing and transfers the signal charges accumulated in the photoelectric conversion unit 11 to the floating diffusion FD. In the transfer transistor TR, a drain is electrically coupled to the floating diffusion FD, and a gate is electrically coupled to a drive signal line.

The floating diffusion FD is an n-type diffusion layer region (N+) formed in a p-type semiconductor layer. The floating diffusion FD is a charge holder that temporarily holds the charge transferred from the photodiode PD and is a charge-voltage converter that generates a voltage based on the charge amount.

The reset transistor RST operates on the basis of a reset signal supplied from a controller via a reset signal line at a predetermined timing and discharges the charges accumulated in the floating diffusion FD. A gate of the reset transistor RST is coupled to the reset signal line. A source/drain region of the reset transistor RST includes n-type semiconductor regions (N+) 12 and 13 formed on the surface S1 of the semiconductor substrate 10. One of the source/drain regions (the n-type semiconductor region (N+) 12) also doubles as the floating diffusion FD, and the other one (the n-type semiconductor region (N+) 13) is coupled to a power supply line VDD.

The amplification transistor AMP amplifies a voltage between a source and a drain using a voltage depending on the charges accumulated in the floating diffusion FD as a gate signal to supply the voltage to the selection transistor SEL as a pixel signal (a light reception signal). A gate of the amplification transistor AMP is coupled to one of the source/drain regions (the n-type semiconductor region (N+) 12; the floating diffusion FD) of the reset transistor RST. Although not illustrated, the source/drain region of the amplification transistor AMP includes an n-type semiconductor region (N+) formed on the surface S1 of the semiconductor substrate 10 similarly to the source/drain region of the reset transistor RST. One of the source/drain regions shares a region with the other of the source/drain regions (the n-type semiconductor region (N+) 13) of the reset transistor RST and is coupled to the power supply line VDD.

The selection transistor SEL operates on the basis of a selection signal supplied from the controller via a selection signal line at a predetermined timing and outputs the pixel signal supplied from the amplification transistor AMP to the vertical signal line Lsig. A gate of the selection transistor SEL is coupled to the selection signal line. Although not illustrated, a source/drain region of the selection transistor SEL includes an n-type semiconductor region (N+) formed on the surface S1 of the semiconductor substrate 10 as with the source/drain region of the reset transistor RST. One of the source/drain regions shares a region with the other source/drain region of the amplification transistor AMP and is coupled to a data output line.

On the surface S1 of the semiconductor substrate 10, a p-type semiconductor region (P+) 14 is further provided as an anode of the photodiode PD. The p-type semiconductor region (P+) 14 is coupled to a fixed potential (for example, the ground GND as a reference potential). In the semiconductor substrate 10, an element isolator 15 is further provided between the adjacent pixels P.

The element isolator 15 electrically isolates the adjacent pixels P. The element isolator 15 is, for example, a so-called STI (Shallow Trench Isolation) provided on the surface S1 of the semiconductor substrate 10 and is provided to surround the pixel P as illustrated in FIG. 4, for example. It is possible to form the element isolator 15 by using an oxide film of, for example, silicon oxide ($SiO_2$), hafnium oxide ($HfO_2$), zirconium oxide ($ZrO_2$), aluminum oxide ($Al_2O_3$), titanium oxide ($TiO_2$), tantalum oxide ($Ta_2O_5$), and the like.

Note that, regarding the element isolator 15, for example, a metal film such as tungsten (W) is buried in an opening where the element isolator 15 is formed, and the oxide film may be formed around the metal film (that is, on a side surface and a bottom surface of the metal film). With this, it is possible to electrically isolate the adjacent pixels P and optically isolate the adjacent pixels P by shielding oblique entering light, which may enter from the adjacent pixels P, by the metal film. Furthermore, for example, the element isolator 15 may be a so-called DTI (Deep Trench Isolation) that passes through between the surface S1 and the surface S2 of the semiconductor substrate 10, as an isolator 130 to be described later.

(Electric Power Generating Unit)

The electric power generating unit 120 includes the one or the plurality of solar cells C provided around the imaging unit 110. The solar cell C is a p-n junction type photodiode PD and includes, for example, a photoelectric conversion unit 21 that is formed on the surface S1 of the semiconductor substrate 10 and includes an n-type semiconductor region (N−). The electric power generating unit 120 further includes an n-type semiconductor region (N+) 22 having an n-type impurity concentration higher than that of the n-type semiconductor region (N−) to be the photoelectric conversion unit 21 and a p-type semiconductor region (P+) 23 on the surface S1 of the semiconductor substrate 10. The n-type semiconductor region (N+) 22 is formed in the n-type semiconductor region (N−) to be the photoelectric conversion unit 21 and is coupled to the reference potential (for example, the ground GND). The p-type semiconductor region (P+) 23 is coupled to the cathode (positive).

The solar cell C takes out a current in which the charge generated by the entering light flows in a forward direction. An output voltage of the solar cell C is determined from a relationship between a current flowing in the photodiode PD and a voltage. A voltage generated in the p-n junction fluctuates depending on the flowing current. For example, in a case of a silicon substrate, a voltage that turns on the photodiode PD (an electromotive force) is about 0.5 V. When a battery is charged, for example, the n-type semiconductor region (N+) 22 is coupled to the ground GND to couple a voltage of the p-type semiconductor region (P+) 23 to a DC-DC conversion circuit or the solar cells C are vertically stacked to increase the voltage. Therefore, a higher voltage is generated in the p-type semiconductor region (P+) 23, and a lower voltage is generated in the n-type semiconductor region (N+) 22.

Incidentally, rate determining includes rate determining caused by an optical cause such as a position gap of the image circle X and rate determining based on a circuit size of the peripheral circuit 210 formed in the second substrate 200 and the like. However, an unused region, around the imaging unit 110, of the semiconductor substrate 10 forming the electric power generating unit 120 is determined on the basis of the optical cause in general. For example, in the imaging device 1 including the rectangular imaging unit 110, four corners of the imaging unit 110 are critical regions with the image circle X in terms of distance. For example, in the imaging device 1 illustrated in FIG. 1, at the four corners of the imaging unit 110, a distance from an outer edge of the imaging unit 110 to the image circle X is the smallest. Therefore, the solar cell C near each of the four corners of the imaging unit 110 is out of the image circle X and does not contribute to generate electric power.

Figure 6A:
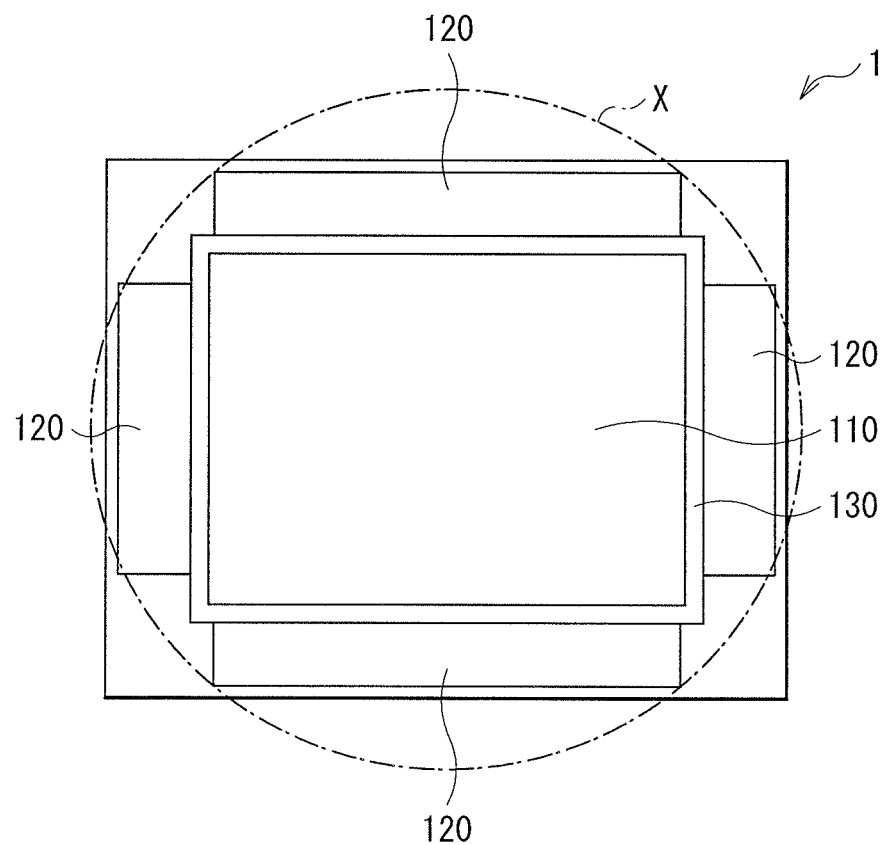
FIG. 6A is a schematic plan view illustrating another example of a formation region of an electric power generating unit in the imaging device illustrated in FIG. 1.
Figure 6B:
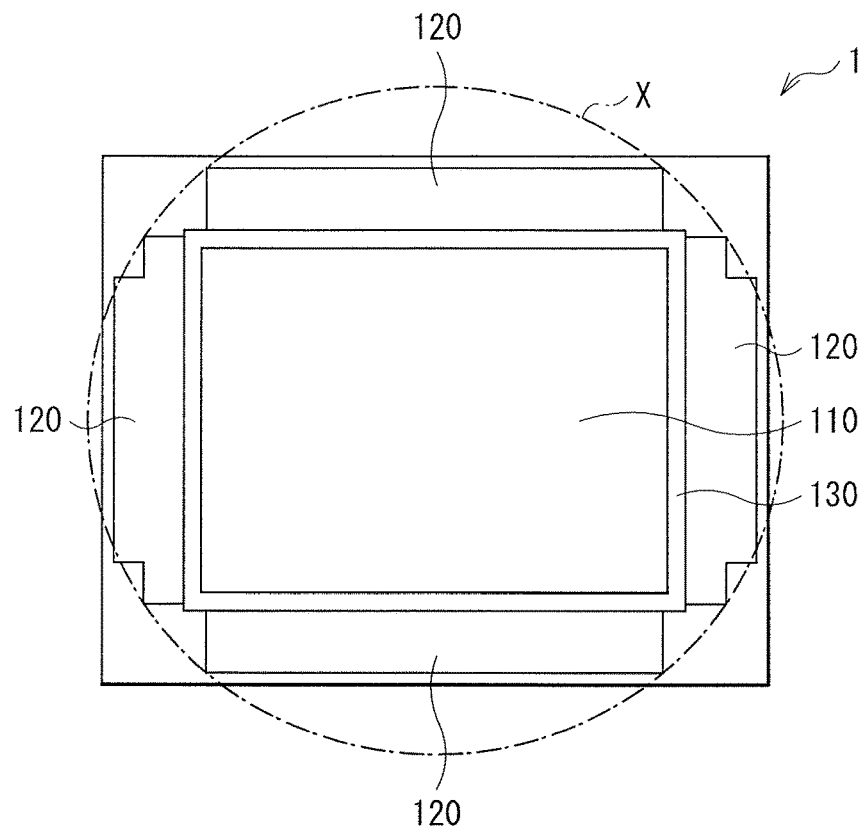
FIG. 6B is a schematic plan view illustrating another example of the formation region of the electric power generating unit in the imaging device illustrated in FIG. 1.
Figure 6C:
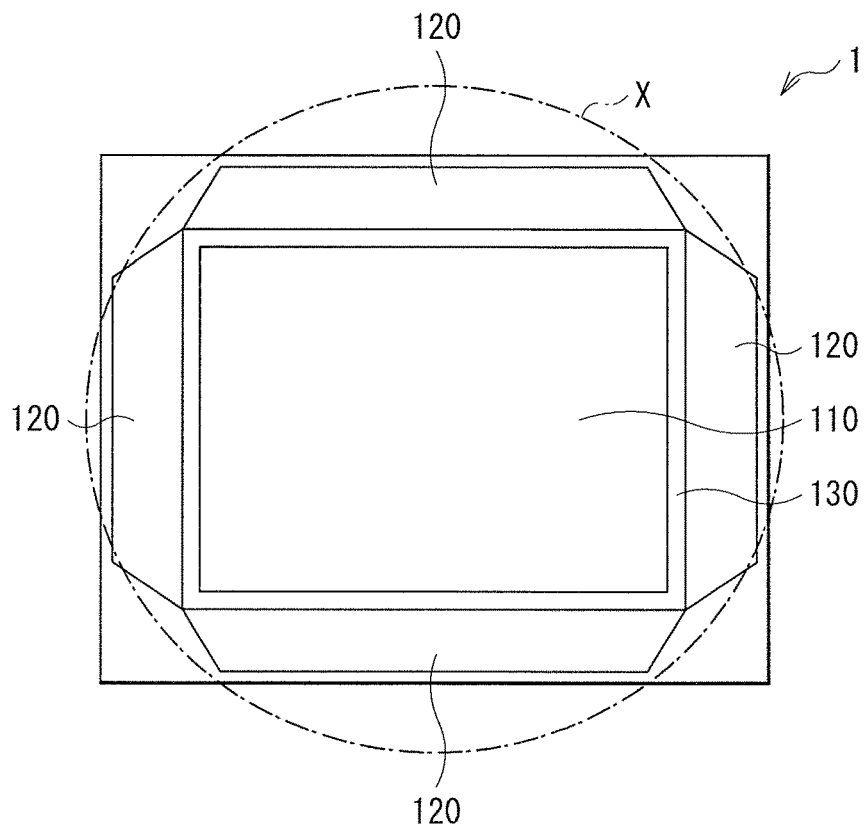
FIG. 6C is a schematic plan view illustrating another example of the formation region of the electric power generating unit in the imaging device illustrated in FIG. 1.

Therefore, in FIG. 1, an example is illustrated in which the electric power generating unit 120 is continuously provided around the imaging unit 110. However, the present disclosure is not limited to this. For example, as illustrated in FIGS. 6A and 6C, the electric power generating unit 120 may be formed only on an inner side of the image circle X irradiated with light. Furthermore, in FIGS. 6A and 6B, the shape of the electric power generating unit 120 in which rectangles are combined is illustrated. However, the shape of the electric power generating unit 120 is not limited to this. For example, as illustrated in FIG. 6C, a trapezoidal electric power generating unit 120 may be provided on each side of the imaging unit 110 having a rectangular shape, for example.

(Isolator)

As described above, the isolator 130 electrically isolates the imaging unit 110 from the electric power generating unit 120. For example, as illustrated in FIG. 1, the isolator 130 is formed to surround the imaging unit 110. For example, it is possible to form the isolator 130 by an n-type semiconductor region (N−) 31 that passes through between the surface S1 and the surface S2 of the semiconductor substrate 10. On the surface S1 of the n-type semiconductor region (N−) 31, an n-type semiconductor region (N+) 32 having an n-type impurity concentration higher than that of the n-type semiconductor region (N−) 31 is provided. This n-type semiconductor region (N+) 32 is coupled to the power supply line VDD as a fixed potential.

When light enters the imaging device 1, a voltage of a p-region (the semiconductor substrate 10) of the electric power generating unit 120 increases. In order to electrically isolate the p-region of the electric power generating unit 120 from the p-region of the imaging unit 110, it is desirable that the p-region of the electric power generating unit 120 and an n-region for isolation (the n-type semiconductor region (N−) 31 configuring the isolator 130) form a sufficient reverse bias. In the present embodiment, as described above, the n-type semiconductor region (N−) 31 is coupled to the power supply line VDD via the n-type semiconductor region (N+) 32. Therefore, a potential difference between the p-region of the electric power generating unit 120 and the n-region for isolation (the n-type semiconductor region (N−) 31) is indicated as a potential of the p-region of the electric power generating unit 120<<a potential of the n-type semiconductor region (N−) 31. As a result, the p-region of the electric power generating unit 120 and the p-region of the imaging unit 110 are electrically isolated from each other.

Note that, in the present embodiment, an example is indicated in which the n-type semiconductor region (N+) 32 is coupled to the power supply line VDD, as with the n-type semiconductor region (N+) 13 of the imaging unit 110. However, if the n-type semiconductor region (N−) 31 becomes equal to or higher than a voltage equal to or higher than the electromotive force of the solar cell C, the present disclosure is not limited to this. For example, in a case of a single stage solar cell C as illustrated in FIG. 3 and the like, the electromotive force thereof is about 0.5 V. Therefore, it is sufficient to apply a voltage larger than 0.5 V to the n-type semiconductor region (N+) 32, and it is possible to electrically isolate the p-region of the electric power generating unit 120 and the p-region of the imaging unit 110 from each other, for example, by applying a voltage of about 1 V.

Figure 7:
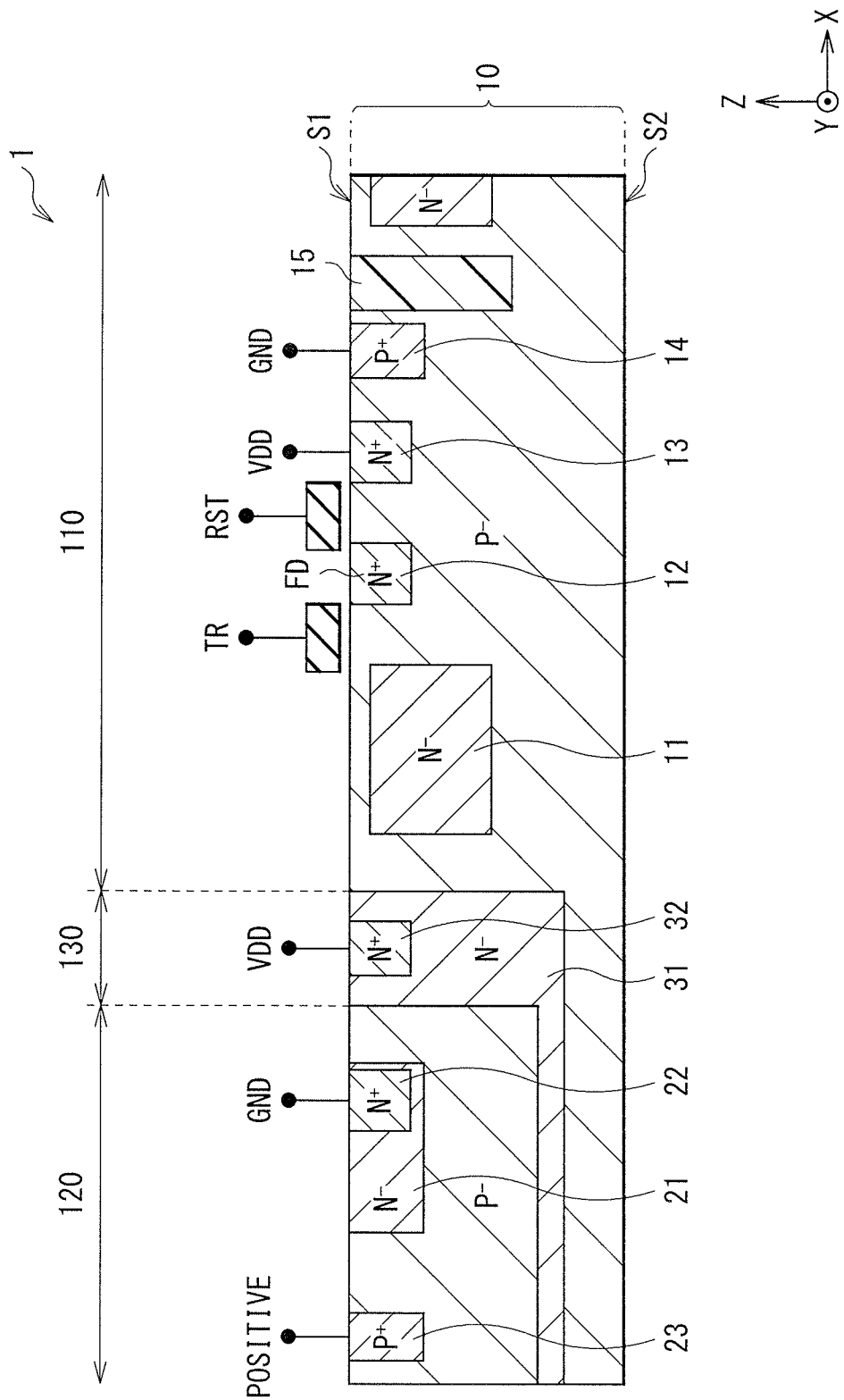
FIG. 7 is a schematic cross-sectional diagram illustrating another example of the configuration taken along the line I-I of the imaging device illustrated in FIG. 1.

Furthermore, in FIG. 3, an example is illustrated in which the isolator 130 is formed by the n-type semiconductor region (N−) 31 that passes through between the surface S1 and the surface S2 of the semiconductor substrate 10. However, the present disclosure is not limited to this. For example, as illustrated in FIG. 7, the imaging unit 110 and the electric power generating unit 120 may be electrically isolated from each other by the n-type semiconductor region (N−) 31 that is formed from the surface S1 of the semiconductor substrate 10 toward the surface S2 and extends in a direction of the electric power generating unit 120 in an internal plane of the semiconductor substrate 10 at a deep position (for example, near the surface S2) in the semiconductor substrate 10.

Figure 8:
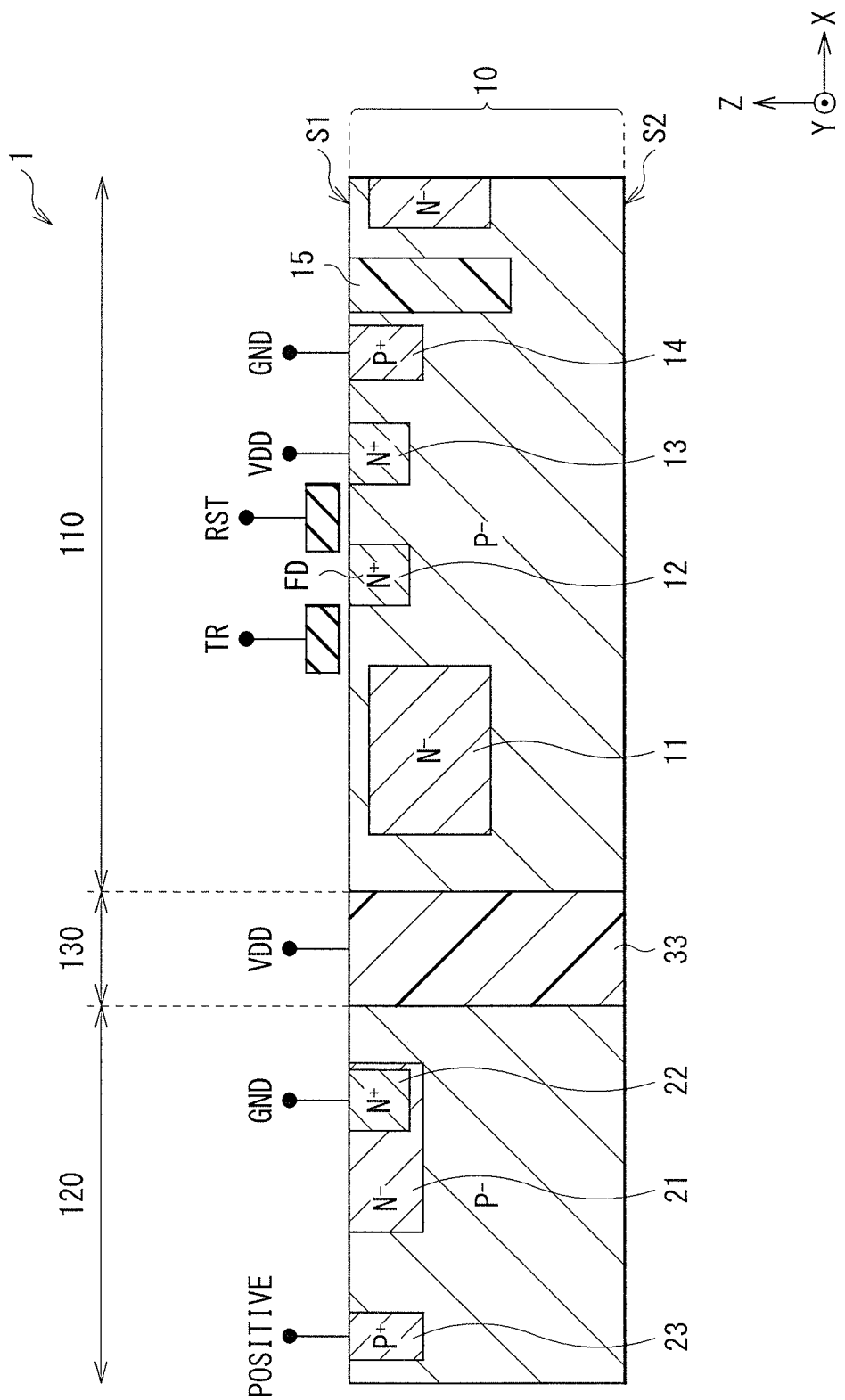
FIG. 8 is a schematic cross-sectional diagram illustrating another example of the configuration taken along the line I-I of the imaging device illustrated in FIG. 1.

Furthermore, it is sufficient for the isolator 130 to electrically isolate the imaging unit 110 and the electric power generating unit 120 from each other. Therefore, for example, as illustrated in FIG. 8, the isolator 130 may be formed by an insulation film 33 that passes through between the surface S1 and the surface S2 of the semiconductor substrate 10 as a so-called DTI (Deep Trench Isolation). It is possible to form the insulation film 33, for example, by using a material similar to that of the element isolator 15. Specifically, as the material of the insulation film 33, for example, silicon oxide ($SiO_2$), hafnium oxide ($HfO_2$), zirconium oxide ($ZrO_2$), aluminum oxide ($Al_2O_3$), titanium oxide ($TiO_2$), tantalum oxide ($Ta_2O_5$), and the like can be mentioned.

Note that, in a case where the isolator 130 is formed by using the n-type semiconductor region (N−) 31, there is a possibility that a parasitic bipolar transistor operates. Therefore, it is preferable that the isolator 130 and the photoelectric conversion unit 21 be provided at positions sufficiently separated from each other. In a case where the isolator 130 is formed by using the insulation film 33, a bipolar transistor is not formed. Therefore, it is possible to provide the photoelectric conversion unit 21 at a position closer to the isolator 130 than in a case where the isolator 130 is formed by using the n-type semiconductor region (N−) 31.

Note that, in FIG. 4, an example is illustrated in which the element isolator 15 adjacent to the isolator 130 of the imaging unit 110 is provided separately from the isolator 130. However, the isolator 130 may double as the element isolator 15.

Basic configurations of the imaging unit 110, the electric power generating unit 120, and the isolator 130 of the imaging device 1 according to the present embodiment have been described above. However, the imaging device 1 may have the following configuration.

Figure 9A:
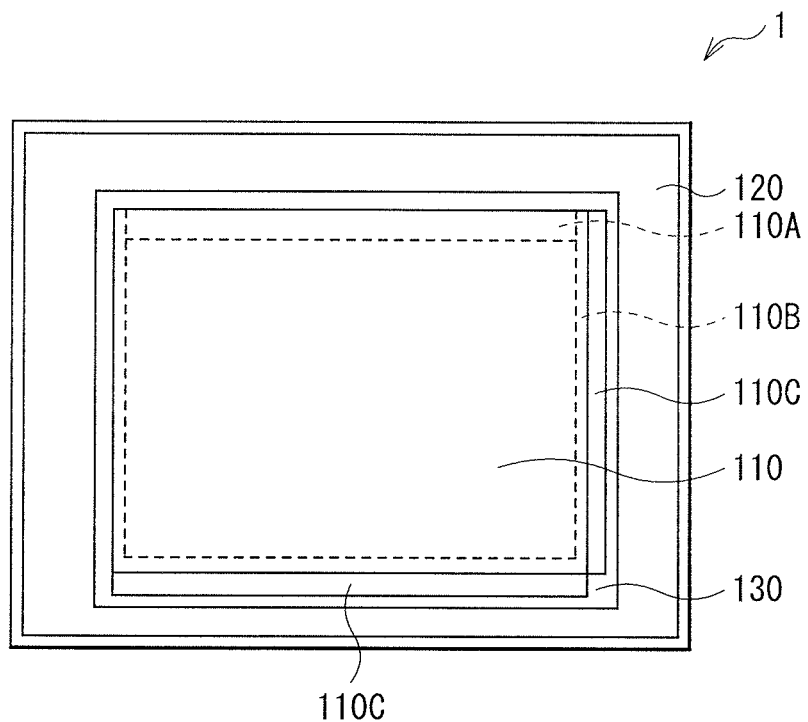
FIG. 9A is a schematic plan view illustrating an example of arrangement of a contact region, an OPB region, and a light shielding region in the imaging device illustrated in FIG. 1.

For example, as illustrated in FIG. 9A, in the imaging device 1, an optical black (OPB) region 110A used to output optical black to be a reference of a black level may be formed on one side of the imaging unit 110 having a rectangular shape. Furthermore, in the imaging device 1, for example, a dummy pixel region 110B in which a dummy pixel having a configuration similar to that of each pixel P is formed may be provided along an entire periphery of the imaging unit 110. Moreover, a contact region 110C may be provided around the imaging unit 110.

Figure 9B:
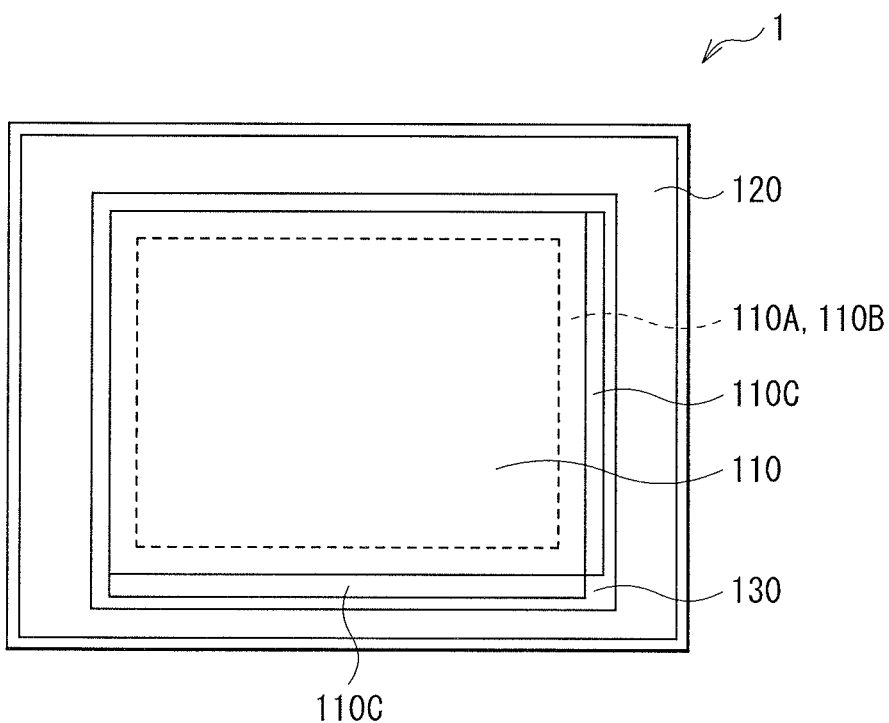
FIG. 9B is a schematic plan view illustrating another example of the arrangement of the OPB region in the imaging device illustrated in FIG. 1.
Figure 9C:
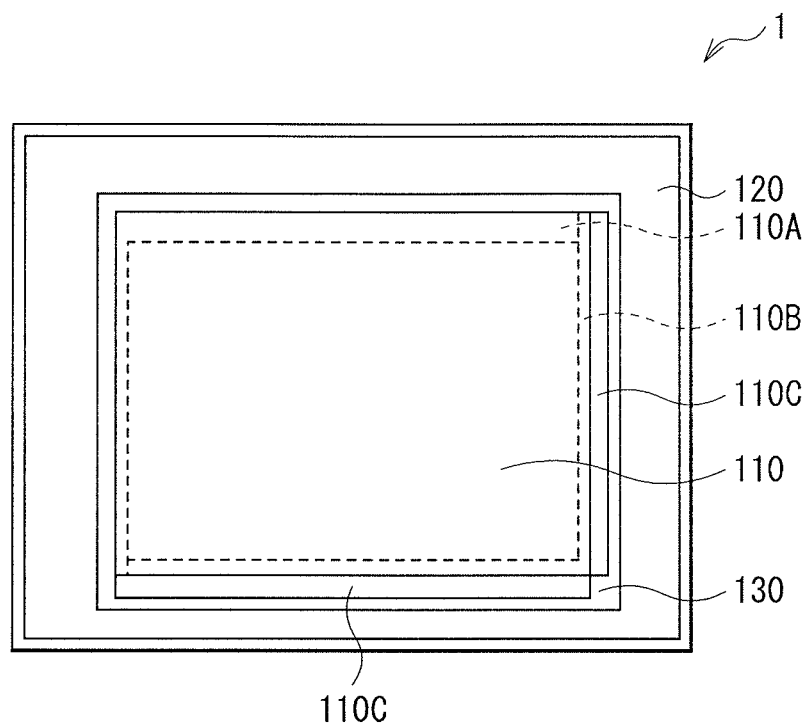
FIG. 9C is a schematic plan view illustrating another example of the arrangement of the OPB region in the imaging device illustrated in FIG. 1.

Note that, for example, the OPB region 110A may be formed along the entire periphery of the imaging unit 110 as illustrated in FIG. 9B or may be formed along adjacent two sides as illustrated in FIG. 9C. Furthermore, it is not necessary to provide the dummy pixel region 110B along the entire periphery of the imaging unit 110 and, for example, may be formed along only one side.

Figure 10A:
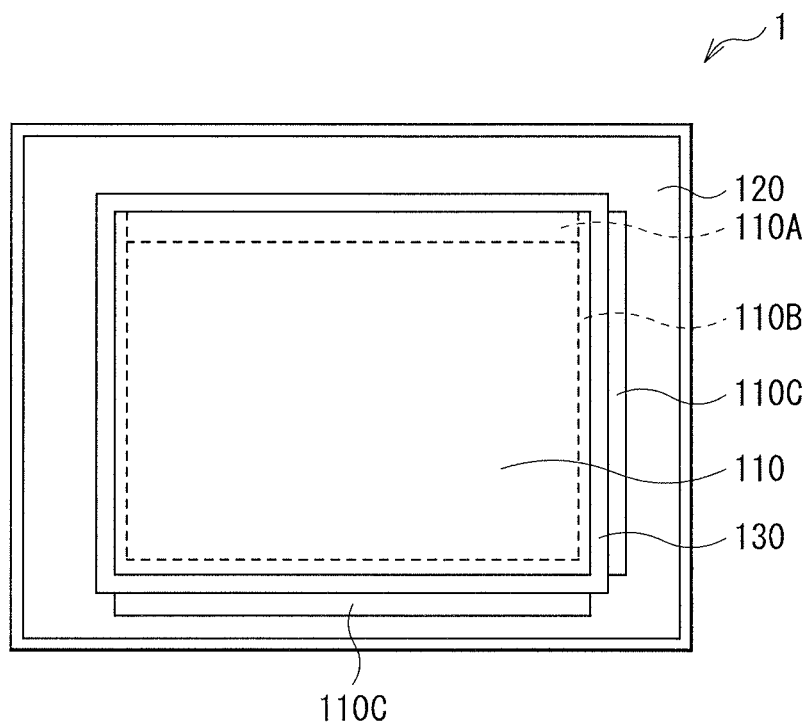
FIG. 10A is a schematic plan view illustrating another example of the arrangement of the contact region in the imaging device illustrated in FIG. 1.
Figure 10B:
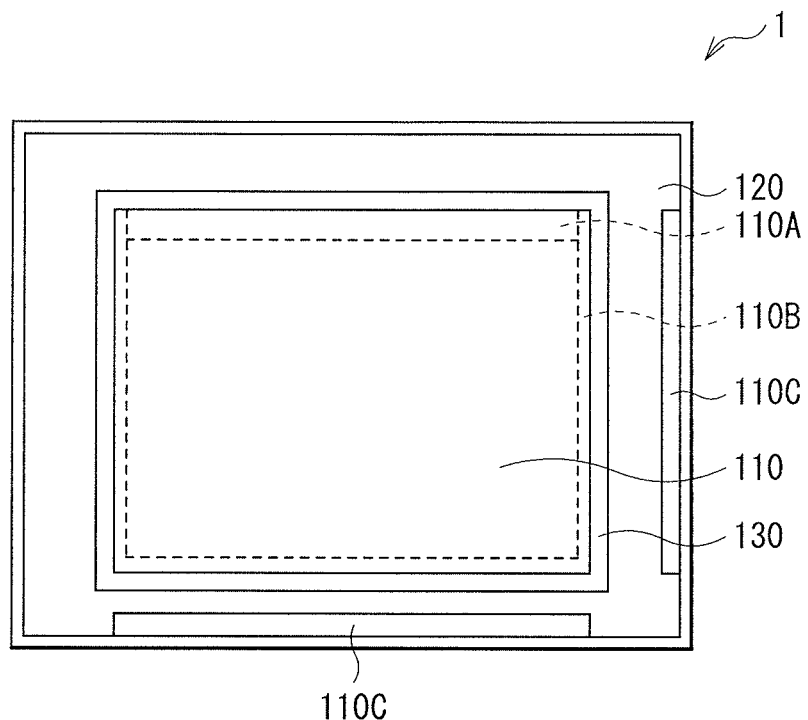
FIG. 10B is a schematic plan view illustrating another example of the arrangement of the contact region in the imaging device illustrated in FIG. 1.
Figure 10C:
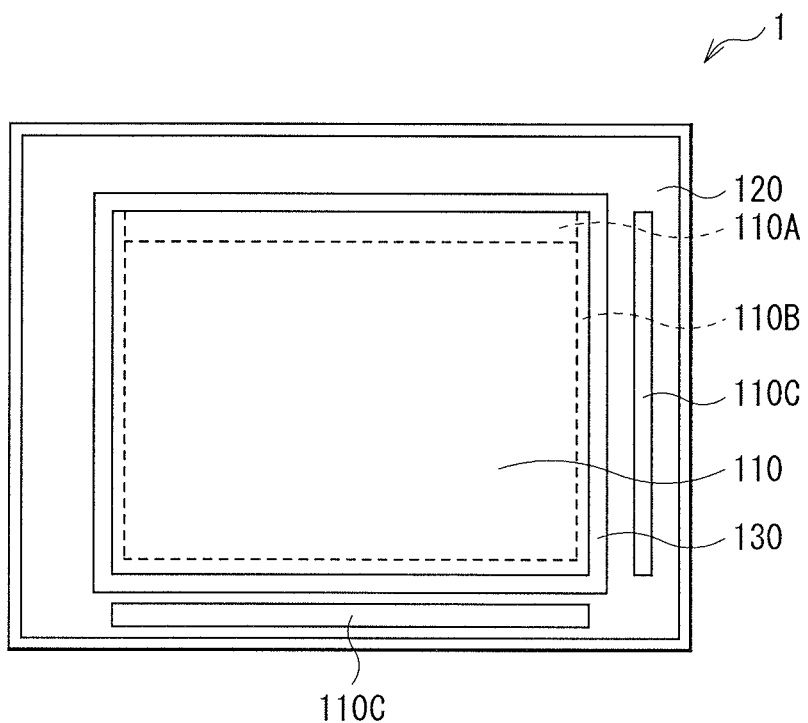
FIG. 10C is a schematic plan view illustrating another example of the arrangement of the contact region in the imaging device illustrated in FIG. 1.

In FIG. 9A, an example is illustrated in which the contact region 110C is provided between the imaging unit 110 and the isolator 130. However, for example, as illustrated in FIG. 10A, the contact region 110C may be provided between the isolator 130 and the electric power generating unit 120. Alternatively, the contact region 110C may be provided in contact with the periphery of the electric power generating unit 120 as illustrated in FIG. 10B or may be provided in the electric power generating unit 120 as illustrated in FIG. 10C. Moreover, in FIG. 9A, an example is illustrated in which the contact regions 110C are formed along only two sides. However, the contact regions 110C may be provided along four sides, including upper, lower, left, and right sides, of the imaging unit 110 having a rectangular shape.

Moreover, in the imaging device 1, for example, a color filter, a light shielding film, and an on-chip lens may be provided on the rear surface (the surface S2) side of the semiconductor substrate 10.

It is possible to form the color filter across an entire surface of the semiconductor substrate 10. Note that, as the color filter provided on the electric power generating unit 120, that of white (W) is preferable from a viewpoint of a photoelectric conversion efficiency. However, as in the imaging unit 110, any of red (R), green (G), and blue (B) filters may be provided in a viewpoint of manufacturing cost. In that case, it is preferable to use the green (G) filter having the highest sensitivity.

The light shielding film is formed, for example, between the pixels P of the imaging unit 110 in which the plurality of pixels P is arranged in a two dimensional array and above the OPB region 110A and the dummy pixel region 110B formed along the periphery of the imaging unit 110.

The on-chip lens collects light that has entered the on-chip lens from above on a light receiving surface of each pixel P that is arranged in a two-dimensional array on the imaging unit 110. Therefore, it is not necessary to provide the on-chip lens for the electric power generating unit 120, the isolator 130, and the like. However, for example, in order to maintain symmetry of the uppermost layer of the imaging device 1, the on-chip lens may be disposed across the front surface of the semiconductor substrate 10 as with the color filter. Furthermore, in a case where the on-chip lens is provided in the electric power generating unit 120, pupil correction may be performed.

1-2. Operation of Imaging Device

The imaging device 1 according to the present embodiment acquires the signal charge (here, the electron) from each pixel P as follows. When light enters the imaging device 1 through the optical system 310, the light passes through the on-chip lens, the color filter, and the like and is detected (absorbed) by the photoelectric conversion unit 11 of each pixel P in the imaging unit 110, and color light of red (R), green (G), or blue (B) is photoelectrically converted. A reverse bias is applied to each pixel P. With this, the electron among the pair of the electron and the hole generated by the photoelectric conversion unit 11 is moved to and accumulated in the n-type semiconductor region (N−) configuring the photoelectric conversion unit 11, and the hole is moved to the p-type semiconductor region and is discharged.

In the electric power generating unit 120, light that has entered the electric power generating unit 120 through the optical system 310 generates the charge in the photoelectric conversion unit 21 configuring the solar cell C. A forward bias is applied to the solar cell C. An output current is taken out from the cathode (positive) coupled to the p-type semiconductor region (P+) 23. The current taken out from the cathode (positive) is used as an operation current of the imaging unit 110 or used to charge a battery built in an electronic apparatus including the imaging device 1, for example, a camera 2 (for example, refer to FIG. 25) and the like.

Figure 11A:
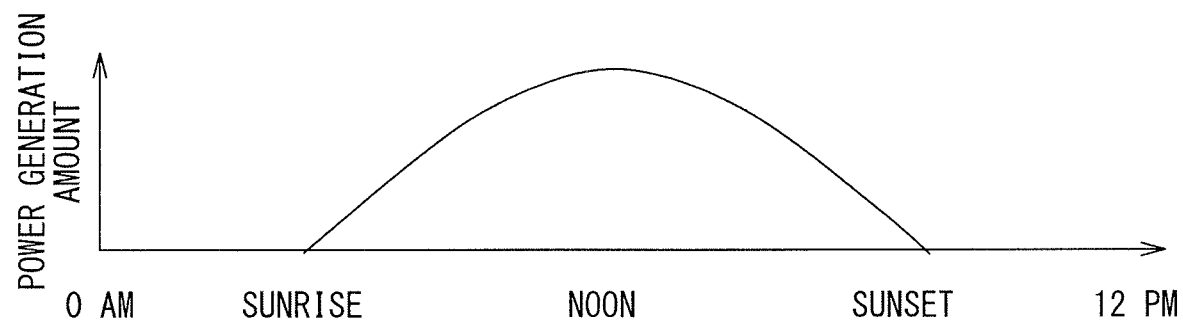
FIG. 11A is a diagram illustrating variation over time in a power generation amount by the electric power generating unit per day in the imaging device illustrated in FIG. 1.
Figure 11B:
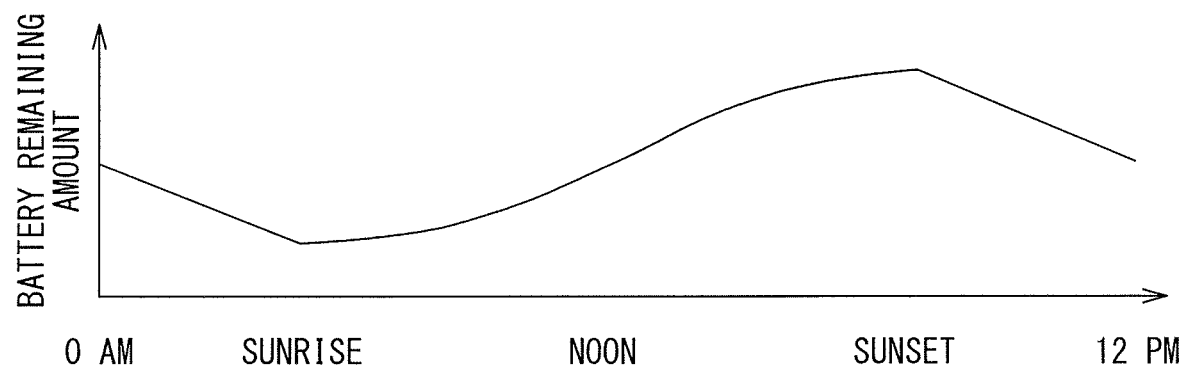
FIG. 11B is a diagram illustrating variation over time in a battery remaining amount per day of the imaging device illustrated in FIG. 1.

FIG. 11A illustrates variation over time in a power generation amount per day of the electric power generating unit 120, and FIG. 11B illustrates variation over time in a battery remaining amount per day. The electric power generating unit 120 generates electric power outdoor by using sunlight and the like in the daytime and supplies an operation current to the imaging unit 110, and an excess current is charged in the battery. In a dark place such as the nighttime, a battery current is used as the operation current. In a room and the like, light of fluorescent light and the like is added to sunlight.

Note that the variation over time in the battery remaining amount illustrated in FIG. 11B is an example. Between a case where the imaging unit 110 is constantly operated and a case where the imaging unit 110 is intermittently operated, whether the battery remaining amount continuously decreases or whether the battery remaining amount decreases in a stepwise manner differs. However, the decrease in the battery remaining amount has a similar shape as an average.

1-3. Workings and Effects

In the imaging device 1 according to the present embodiment, the electric power generating unit 120 including the one or the plurality of solar cells C is provided around the imaging unit 110 including the plurality of pixels P. With this, it is possible to provide the electric power generating unit 120 without reducing the number and the area of the pixels P of the imaging unit 110 and without increasing the area of the semiconductor substrate 10 where the imaging unit 110 is provided. This will be described below.

As described above, a battery driving technique with no power supply is desired as the technique for IoT, and there is a power-saved energy harvesting technique as an important technique. As an energy harvesting technique for image sensors, a method mainly using outside light tends to be used. As a general technique, a method of preparing a solar cell separately from an imager and generating electric power has been known. However, at least, it is necessary to correct a pixel used for the imager, and deterioration in noise characteristics, saturation characteristics, and the like is concerned.

In contrast, in the present embodiment, for example, in an imaging device having a three-dimensional structure in which a semiconductor substrate (referred to as an upper chip below) including a plurality of sensor pixels and a semiconductor substrate (referred to as a lower chip below) including a signal processing circuit that processes a signal obtained by each sensor pixel are laminated, a solar cell is disposed in a peripheral portion of the semiconductor substrate including the plurality of sensor pixels. Specifically, as described above, in the imaging device 1 according to the present embodiment, the electric power generating unit 120 including the one or the plurality of solar cells C is provided around the imaging unit 110 including the plurality of pixels P. The imaging unit 110 and the electric power generating unit 120 are provided in the image circle X generated by image formation on the light entering surface (for example, the surface S2 of the semiconductor substrate 10) of the imaging device 1 by the light that has passed through the optical system 310 disposed above the imaging device 1. Furthermore, the isolator 130 is provided between the imaging unit 110 and the electric power generating unit 120, and the imaging unit 110 and the electric power generating unit 120 are electrically isolated from each other by the isolator 130.

In the imaging device having the three-dimensional structure as described above, an image circle created by a lens that guides light from a subject to the imaging device and performs imaging on the light receiving surface of the imaging device is designed, in consideration of a mechanical position gap, to be larger than a pixel array in which the plurality of sensor pixels is arranged. Furthermore, in the upper chip, in order to suppress an influence caused by light reflection from a pad formed in a chip outer peripheral portion and a chip end, a certain distance from the pixel array to the chip outer periphery is secured. Therefore, a main periphery of the upper chip includes a region that is unused and which light enters.

In the present embodiment, the electric power generating unit 120 including the solar cell C is provided in the unused region of the upper chip (specifically, the semiconductor substrate 10 of the first substrate 100). With this, it is possible to achieve an imaging device that has both excellent pixel characteristics and a great power generation amount without reducing the number and the area of the pixels P of the imaging unit 110 and without increasing the area of the semiconductor substrate 10 where the imaging unit 110 is provided.

Second and third embodiments and modification examples (modification examples 1 to 4) of the present disclosure will be described below. Note that the component that is the same as that of the first embodiment described above is denoted with the same reference numeral, and description thereof will be omitted.

Second Embodiment

Figure 12:
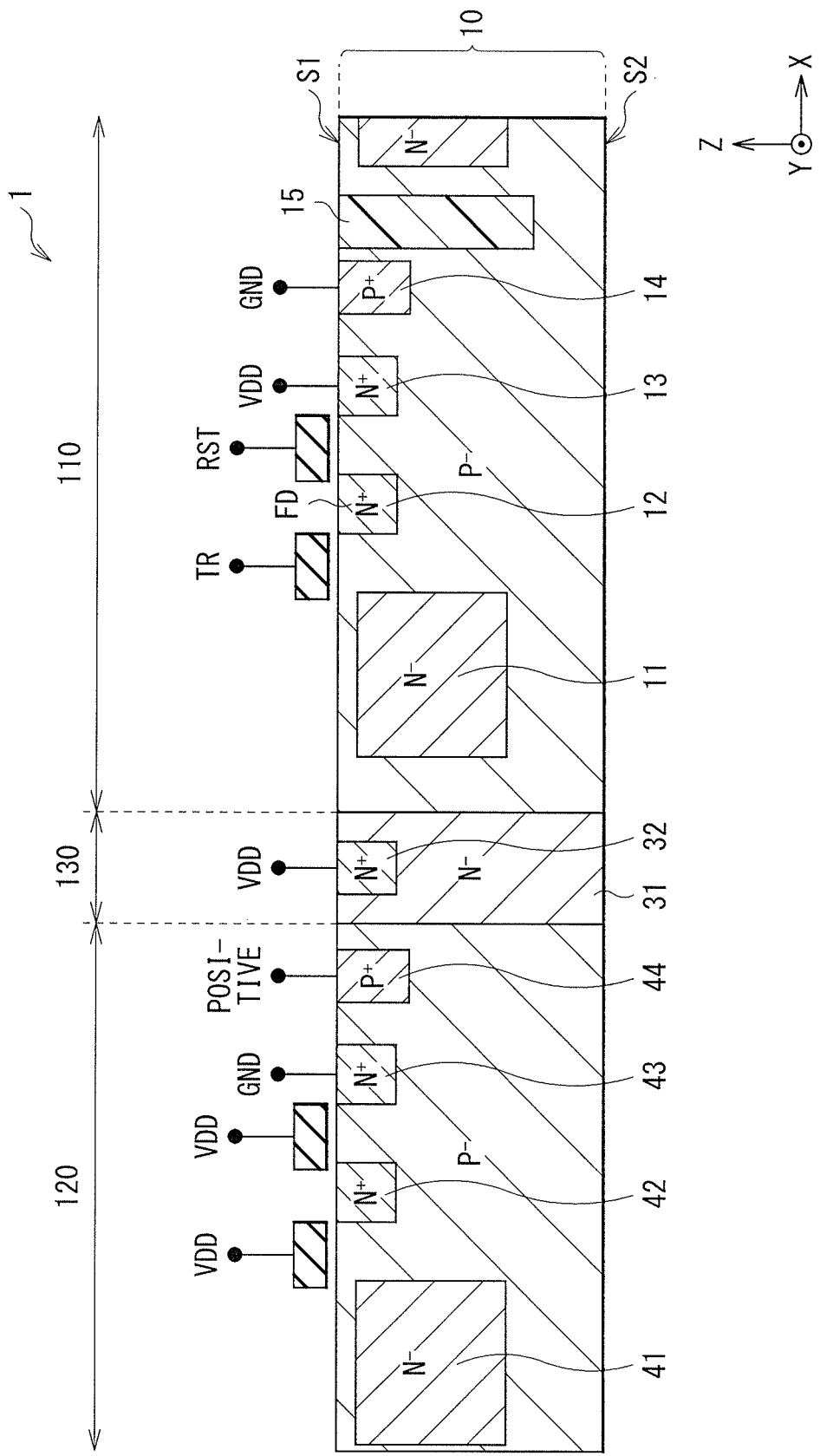
FIG. 12 is a schematic cross-sectional diagram illustrating an example of a configuration of an imaging device according to a second embodiment of the present disclosure.

FIG. 12 illustrates an example of a cross-sectional configuration of an imaging device (an imaging device 1A) according to a second embodiment of the present disclosure. Note that FIG. 12 corresponds to the cross-sectional configuration taken along the line I-I illustrated in FIG. 1. As with the imaging device 1 according to the first embodiment described above, the imaging device 1A is a CCD image sensor or a CMOS image sensor having a battery driving technique with no power supply. The present embodiment is different from the first embodiment described above in that a solar cell C configuring an electric power generating unit 420 has the same structure as each of the plurality of pixels P configuring the imaging unit 110.

As described above, the electric power generating unit 420 includes the solar cell C having the same structure as each of the plurality of pixels P configuring the imaging unit 110. Specifically, the solar cells C provided on the electric power generating unit 420 have similar planar configurations to each other as illustrated in FIG. 13 and have, for example, a similar circuit configuration to an equivalent circuit of the pixel P illustrated in FIG. 5, as illustrated in FIG. 14.

Figure 13:
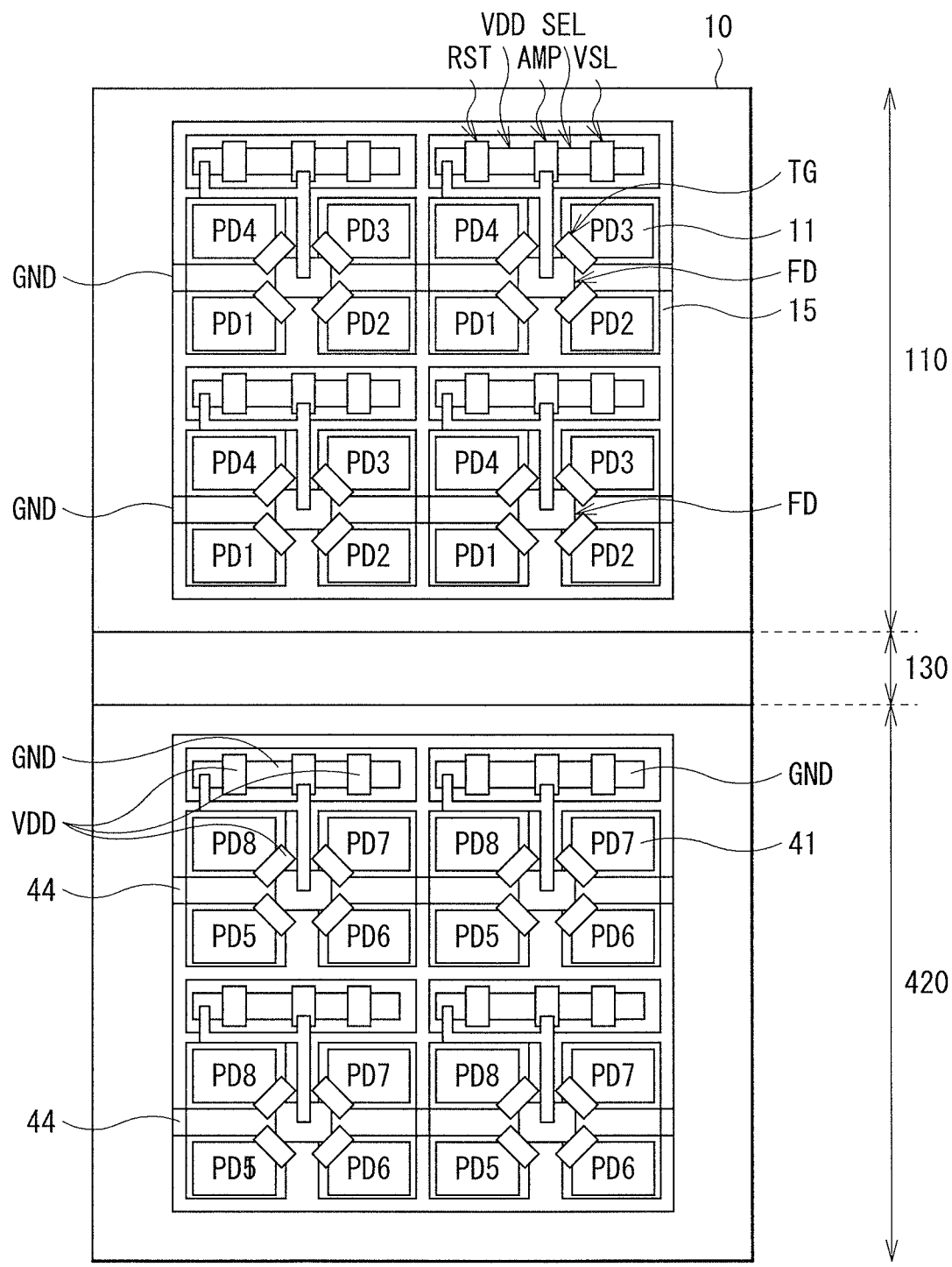
FIG. 13 is a plan view illustrating a specific example of a configuration of the imaging device illustrated in FIG. 12.
Figure 14:
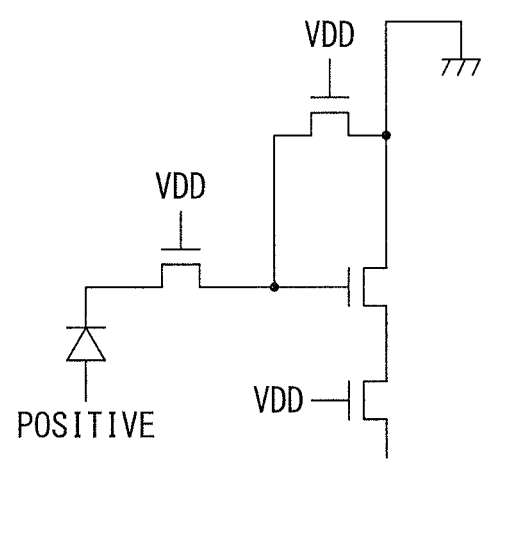
FIG. 14 is an equivalent circuit diagram of a solar cell illustrated in FIG. 12.

Note that FIG. 13 illustrates an example in which element isolators 15 and 45 adjacent to an isolator 130 between the imaging unit 110 and the electric power generating unit 420 are provided separately from the isolator 130. However, the isolator 130 may double as the adjacent element isolators 15 and 45.

Figure 15:
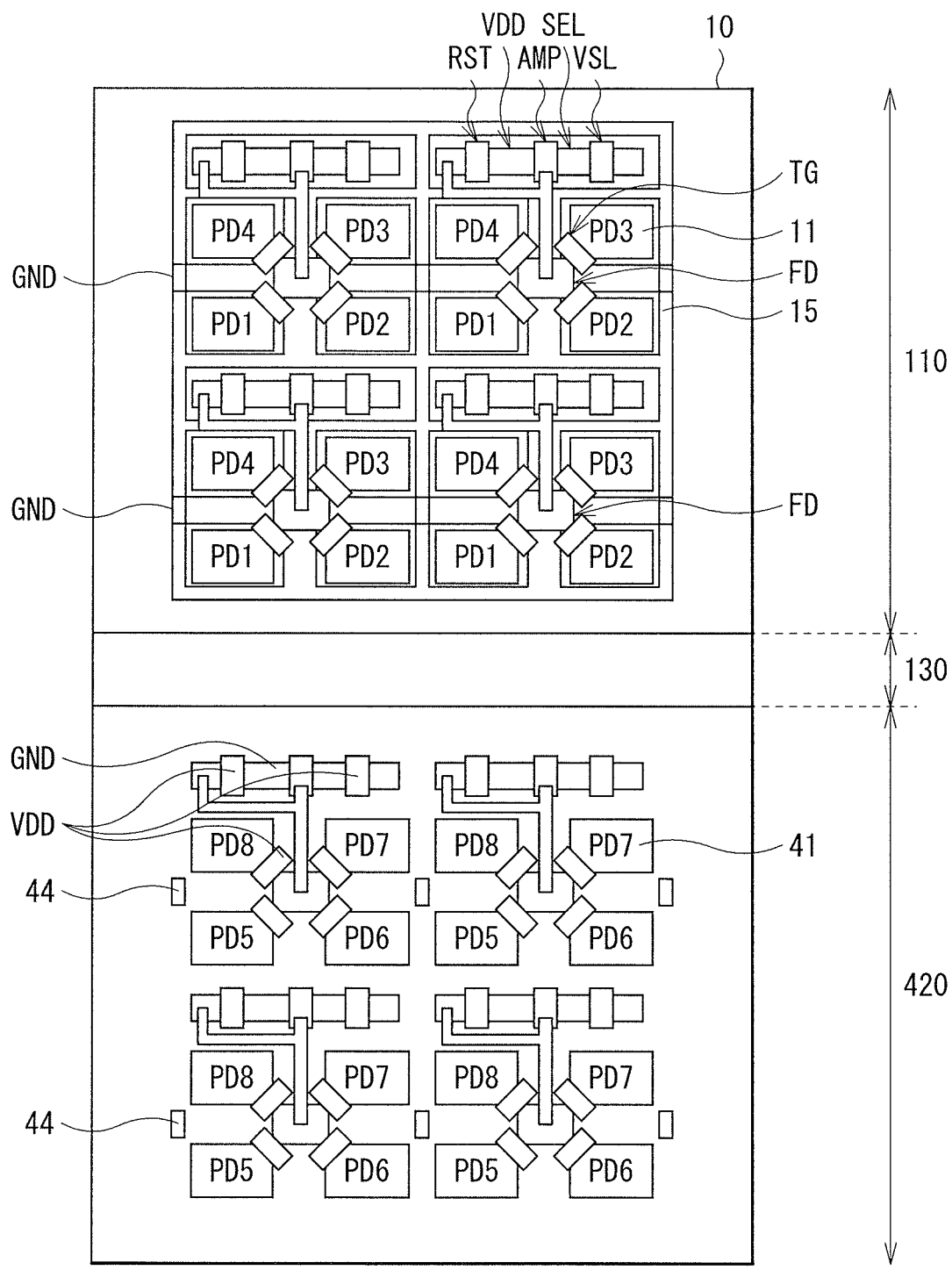
FIG. 15 is a plan view illustrating a specific example of the configuration of the imaging device illustrated in FIG. 12.

Furthermore, it is not necessary for the electric power generating unit 420 to prevent a crosstalk between the adjacent solar cells C. Therefore, as illustrated in FIG. 15, the element isolator 45 may be omitted. In a case where it is desired to maintain symmetry of the imaging unit 110 and the electric power generating unit 420 in terms of a manufacturing process, the element isolator 45 may be provided as illustrated in FIG. 13. However, since there is a possibility that the element isolator 45 causes a dark current, it is preferable not to provide the element isolator 45.

As described above, in the imaging device 1A according to the present embodiment, the electric power generating unit 120 including the solar cell C having the same structure as the pixel P configuring the imaging unit 110 is provided around the imaging unit 110 that is the unused region of the semiconductor substrate 10. With this, an effect similar to that of the first embodiment described above is obtained, and it is possible to simplify the manufacturing process.

3. Third Embodiment

Figure 16:
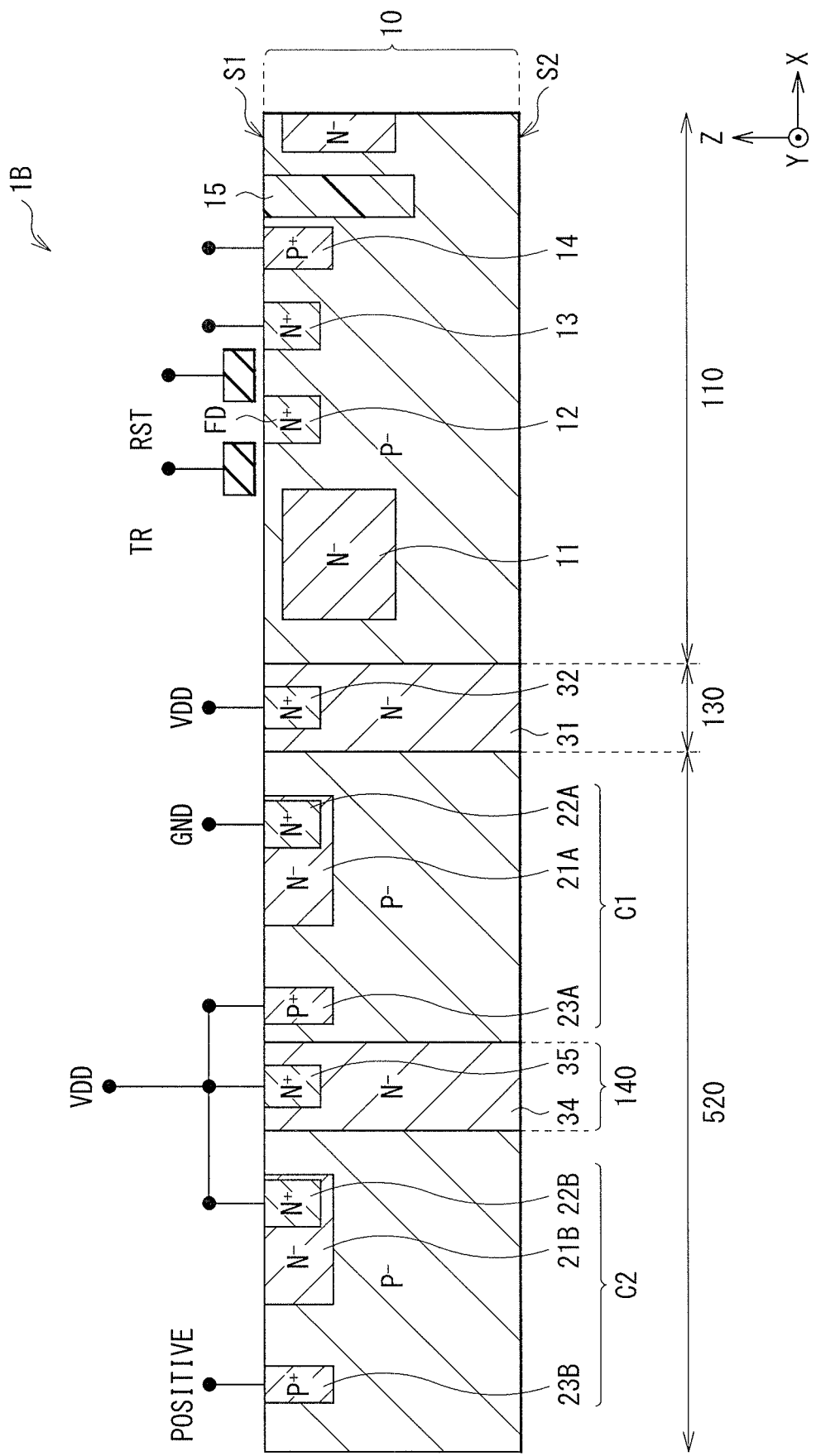
FIG. 16 is a schematic cross-sectional diagram illustrating an example of a configuration of an imaging device according to a third embodiment of the present disclosure.
Figure 17:
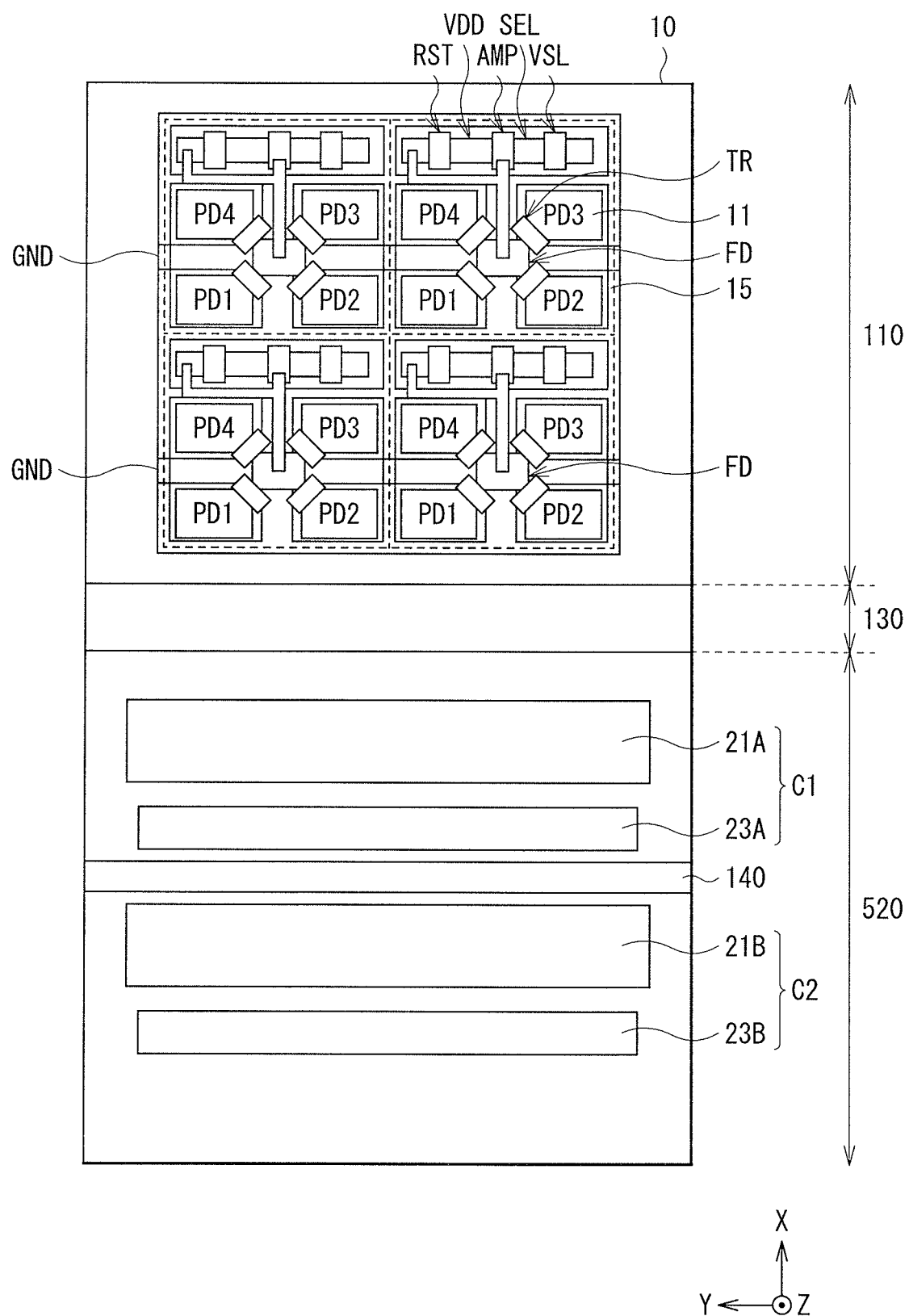
FIG. 17 is a plan view illustrating a specific example of a configuration of an imaging device illustrated in FIG. 18.

FIG. 16 illustrates an example of a cross-sectional configuration of an imaging device (an imaging device 1B) according to a third embodiment of the present disclosure. FIG. 17 schematically illustrates a specific example of a planar configuration of the imaging device 1B illustrated in FIG. 16. Note that FIG. 16 corresponds to the cross-sectional configuration taken along the line I-I illustrated in FIG. 1. As with the imaging device 1 according to the first embodiment described above, the imaging device 1B is a CCD image sensor or a CMOS image sensor having a battery driving technique with no power supply. The present embodiment is different from the first embodiment described above in that solar cells C configuring an electric power generating unit 520 are a multi-stage solar cell C (two stages in FIG. 16).

The electric power generating unit 520 includes a multi-stage solar cell, for example, in which the two solar cells C (solar cells C1 and C2) are formed around the imaging unit 110. In the multi-stage electric power generating unit 520 as illustrated in FIG. 16, for example, an isolator 140, for example, having a configuration similar to that of the isolator 130 is provided between the solar cells C1 and C2. Specifically, the isolator 140 includes an n-type semiconductor region (N−) 34, and on a surface (a surface S1) of the isolator 140, an n-type semiconductor region (N+) 35 having an n-type impurity concentration higher than that of the n-type semiconductor region (N−) 34 is provided. The solar cells C1 and C2 are cascode-coupled to each other, and the n-type semiconductor region (N+) 35 is coupled to a power supply line VDD together with a p-type semiconductor region (P+) 23A of the solar cell C1 and an n-type semiconductor region (N+) 22B of the solar cell C2. At this time, a voltage equal to or higher than the maximum voltage generated by the electric power generating unit 520 is applied to the n-type semiconductor region (N+) 35.

As described above, in the imaging device 1B according to the present embodiment, the electric power generating unit 120 including the multi-stage solar cell C is provided around the imaging unit 110 that is the unused region of the semiconductor substrate 10. With this, an effect similar to that of the first embodiment is obtained, and an effect is obtained such that it is possible to improve a power generation amount of the electric power generating unit 520.

4. Modification Example

4-1. Modification Example 1

Figure 18A:
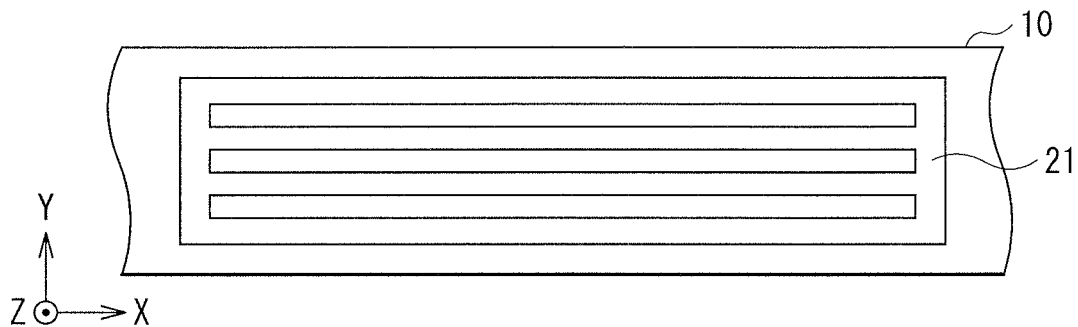
FIG. 18A is a schematic plan view illustrating another example of a shape of a photoelectric conversion unit of an electric power generating unit according to modification example 1 of the present disclosure.
Figure 18B:
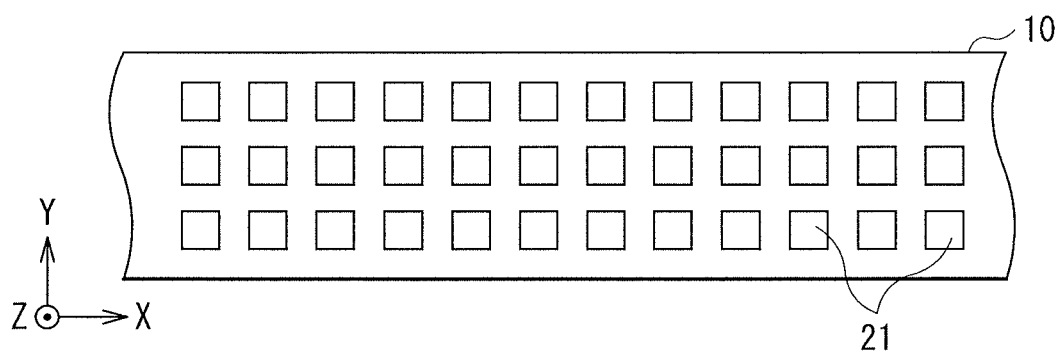
FIG. 18B is a schematic plan view illustrating another example of the shape of the photoelectric conversion unit of the electric power generating unit according to the first modification example of the present disclosure.
Figure 18C:
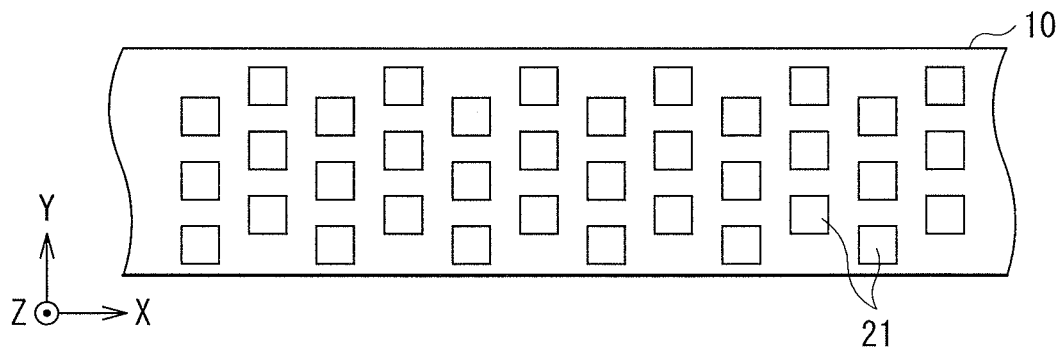
FIG. 18C is a schematic plan view illustrating another example of the shape of the photoelectric conversion unit of the electric power generating unit according to the modification example 1 of the present disclosure.
Figure 19:
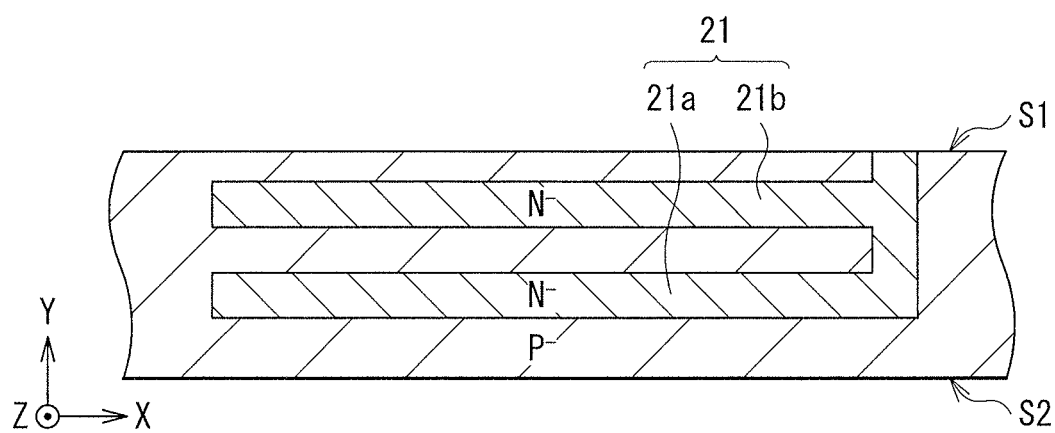
FIG. 19 is a schematic cross-sectional diagram illustrating another example of the shape of the photoelectric conversion unit of the electric power generating unit according to the modification example 1 of the present disclosure.

FIGS. 18A to 18C illustrate other examples of the planar shape of the photoelectric conversion unit 21 configuring the solar cell C of the electric power generating unit 120 of the imaging device 1 according to the first embodiment described above as a modification example (modification example 1) of the present disclosure. An n-type semiconductor region (N−) configuring the photoelectric conversion unit 21 may be formed, for example, in a comb-like shape as illustrated in FIG. 18A or in a dot-like shape as illustrated in FIG. 18B. In a case where the n-type semiconductor region (N−) is formed in a comb-like shape, for example, an n-type semiconductor region (N−) that extends in the Y-axis direction may be formed on only one side of a plurality of n-type semiconductor regions (N−) extending in the X-axis direction or in the middle of the plurality of n-type semiconductor regions (N−) extending in the X-axis direction. In a case where the n-type semiconductor regions (N−) are formed in a dot-like shape, the n-type semiconductor regions (N−) may be arranged in a row as illustrated in FIG. 18B or arranged in zigzag as illustrated in FIG. 18C. Moreover, the n-type semiconductor regions (N−) configuring the photoelectric conversion unit 21 may have a configuration in which the n-type semiconductor regions (N−) (n-type semiconductor regions (N−) 21a and 21b) are laminated in a film thickness direction (the Z-axis direction) of the semiconductor substrate 10 having a p-type semiconductor region (P−) interposed in between, for example, as illustrated in FIG. 19.

In this way, by forming the photoelectric conversion unit 21 (the n-type semiconductor regions (N−)) configuring the solar cell C in the above shape, a joint area (a p-n junction area) between the n-type semiconductor region (N−) and the p-type semiconductor region (P−) improves. With this, it is possible to improve a power generation amount of the electric power generating unit 120.

4-2. Modification Example 2

Figure 20:
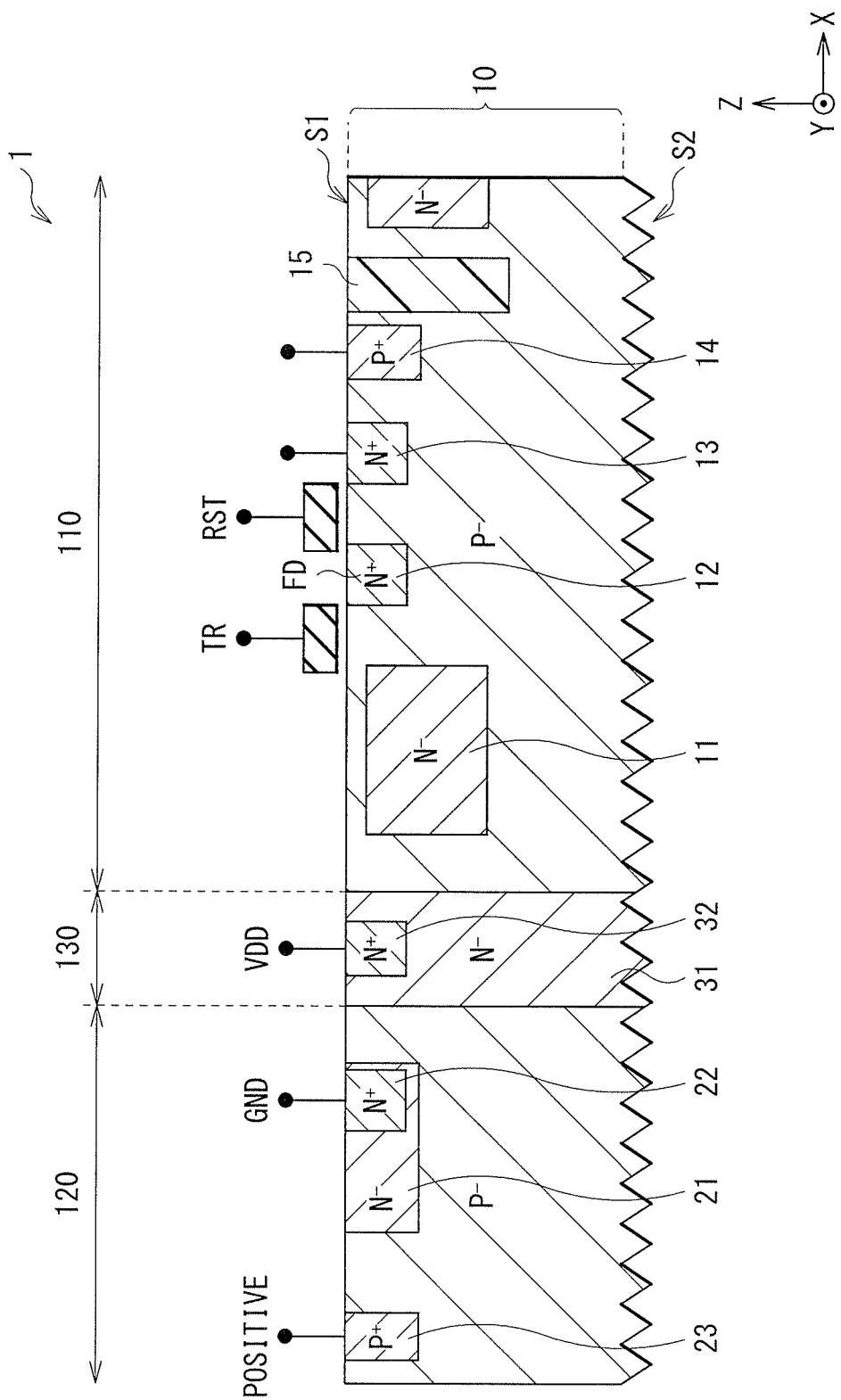
FIG. 20 is a schematic cross-sectional diagram illustrating an example of a configuration of an imaging device according to modification example 2 of the present disclosure.

In FIG. 20, the surface S2 of the semiconductor substrate 10 to be the light entering surface of the imaging device 1 according to the first embodiment described above has an uneven structure as a modification example (modification example 2) of the present disclosure. In this way, by forming the light entering surface having the uneven structure, for example, sensitivity of a wavelength in a near-infrared band is improved, and it is possible to improve an electric power generation efficiency of the electric power generating unit 120.

4-3. Modification Example 3

Figure 21:
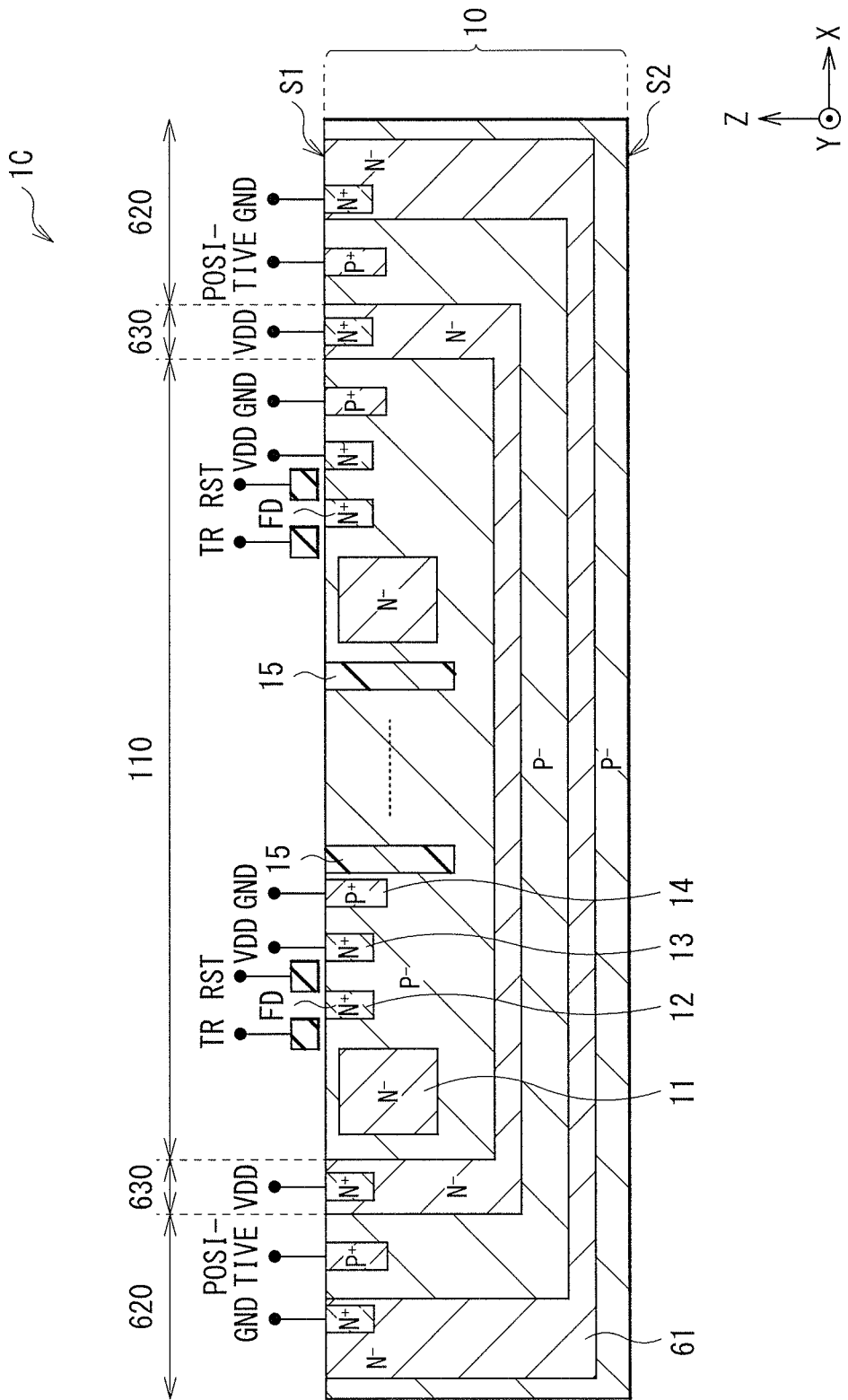
FIG. 21 is a schematic cross-sectional diagram illustrating an example of a configuration of an imaging device according to modification example 3 of the present disclosure.

FIG. 21 illustrates an example of a cross-sectional configuration of an imaging device 1C according to a modification example (modification example 3) of the present disclosure. Note that FIG. 21 corresponds to the cross-sectional configuration taken along the line I-I illustrated in FIG. 1. The imaging device 1C according to the present modification example is different from that in the first embodiment described above in that the imaging device 1C is a so-called front-side illuminated imaging device in which the front side (the surface S1) of the semiconductor substrate 10 is a light irradiation surface and an electric power generating unit 620 extends across an entire rear surface (the surface S2) of the semiconductor substrate 10 and is partially laminated on the imaging unit 110. Specifically, the present modification example is different from the first embodiment described above in that a photoelectric conversion unit 61 (an n-type semiconductor region (N−)) configuring a solar cell C is formed to be extended from the surface (the surface S1) of the semiconductor substrate 10 into a plane near the rear surface (the surface S2). Furthermore, in the imaging device 1C according to the present modification example, in order to electrically isolate the imaging unit 110 and the electric power generating unit 620 from each other, an isolator 630 is also formed to be extended from the surface S1 of the semiconductor substrate 10 in an in-plane direction in the semiconductor substrate 10.

Note that, in FIG. 21, an example is illustrated in which the photoelectric conversion unit 61 (the n-type semiconductor region (N−)) configuring the solar cell C extends in the semiconductor substrate 10 near the rear surface (the surface S2). The photoelectric conversion unit 61 (the n-type semiconductor region (N−)) may be extended and formed as facing the rear surface (the surface S2) of the semiconductor substrate 10 as illustrated in FIG. 22.

Figure 22:
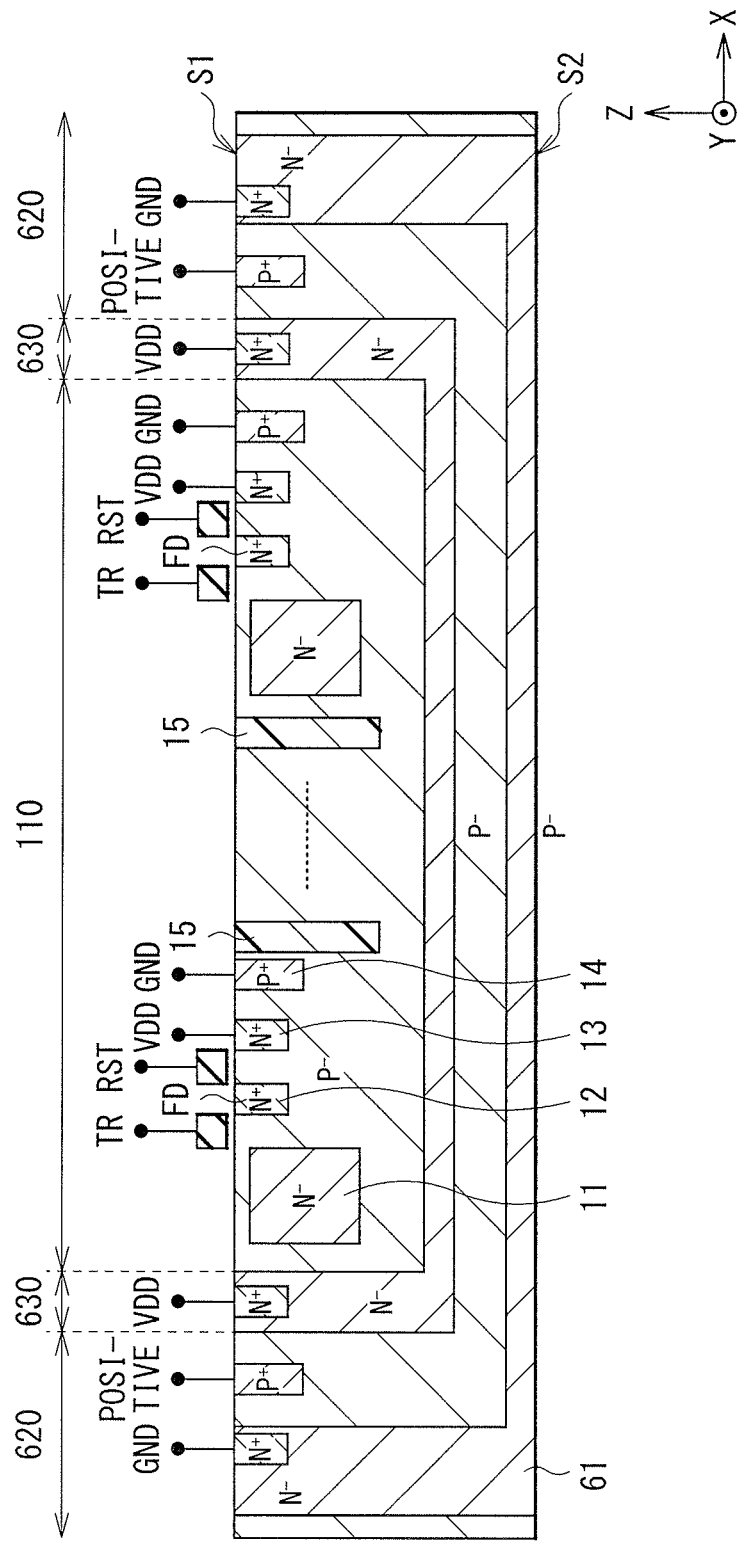
FIG. 22 is a schematic cross-sectional diagram illustrating another example of the configuration of the imaging device according to the modification example 3 of the present disclosure.

Furthermore, in a case where the imaging device 1C illustrated in FIGS. 21 and 22 is used as a Time-of-Flight (ToF) method distance measurement image sensor, it is possible to use the imaging device 1C as a rear-side illuminated imaging device.

4-4. Modification Example 4

Figure 23:
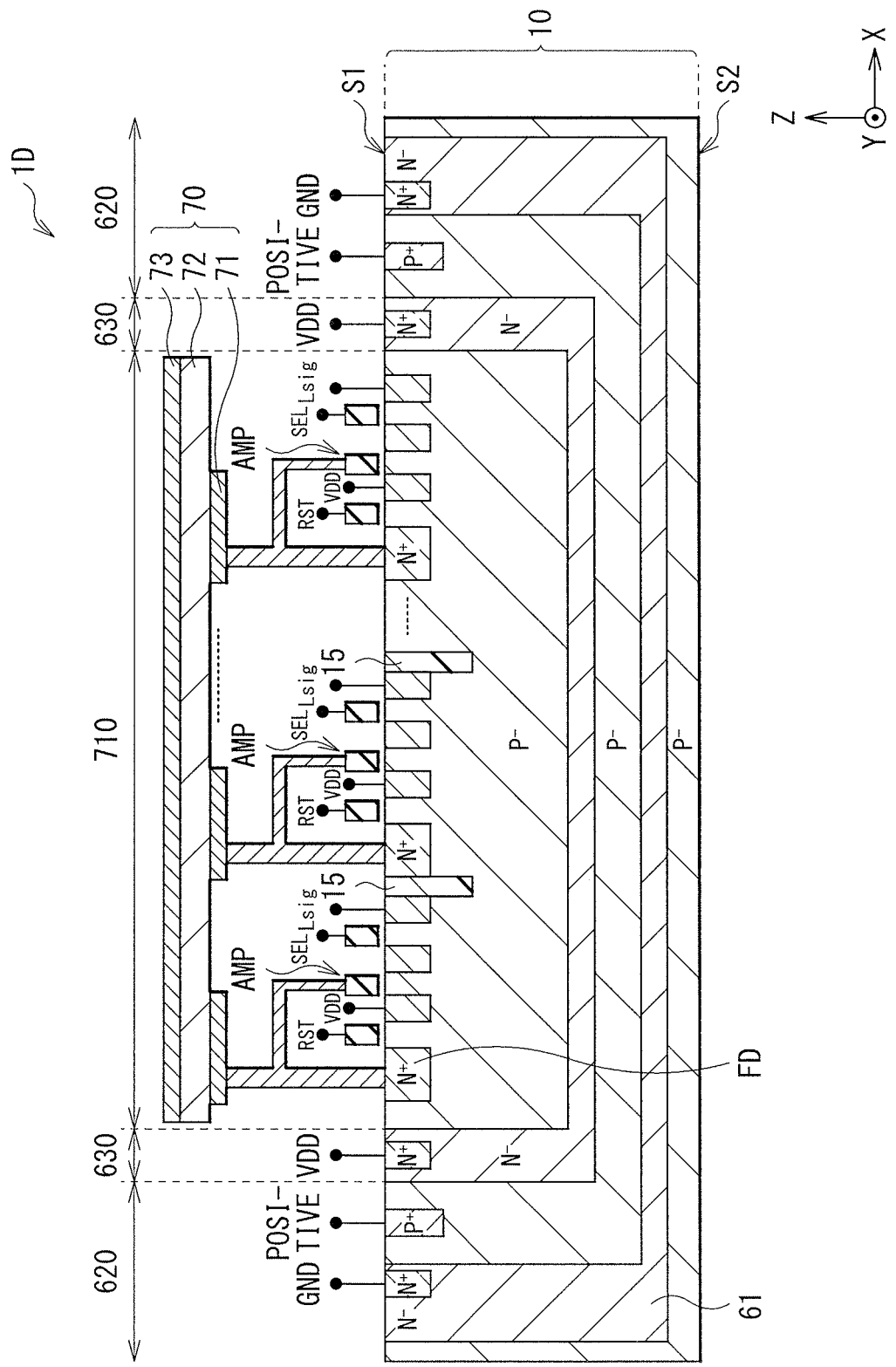
FIG. 23 is a schematic cross-sectional diagram illustrating an example of a configuration of an imaging device according to modification example 4 of the present disclosure.

FIG. 23 illustrates an example of a cross-sectional configuration of an imaging device 1D according to a modification example (modification example 4) of the present disclosure. For example, it is not necessary for the photoelectric conversion unit configuring the imaging unit 110 of the imaging device (for example, the imaging device 1) described in the foregoing first embodiment and the like to be the photodiode PD provided in the semiconductor substrate 10. For example, as the imaging device 1D illustrated in FIG. 23, the photoelectric conversion unit may include, for example, an organic photoelectric conversion unit 70 including a photoelectric conversion layer 72 formed by using an organic material.

The organic photoelectric conversion unit 70 has a configuration in which, for example, a lower electrode 71, the photoelectric conversion layer 72, and an upper electrode 73 are laminated in this order, and, for example, the organic photoelectric conversion unit 70 is provided on the surface S1 side of the semiconductor substrate 10. The lower electrode 71 is divided and formed for each pixel P by a conductive film having light transparency, for example, ITO and the like. The photoelectric conversion layer 72 includes, for example, a p-type semiconductor and an n-type semiconductor and has a bulk heterojunction structure in a layer. The bulk heterojunction structure is a p-n junction surface formed by mixing the p-type semiconductor and the n-type semiconductor. The p-type semiconductor relatively functions as an electron donor (donor), and the n-type semiconductor relatively functions as an electron acceptor (acceptor). It is possible to form the photoelectric conversion layer 72, for example, across the entire surface of the imaging unit 110. The upper electrode 73 includes a conductive film having light transparency, as with the lower electrode 71. For example, the upper electrode 73 may be separated and formed for each pixel as with the lower electrode 71 or may be formed as a common electrode for the pixels P as with the photoelectric conversion layer 72.

Note that another layer may be provided between the lower electrode 71 and the photoelectric conversion layer 72 and between the photoelectric conversion layer 72 and the upper electrode 73.

In the organic photoelectric conversion unit 70, light that has entered from the upper electrode 73 side is absorbed by the photoelectric conversion layer 72, and an exciton caused by this is moved to an interface between the electron donor and the electron acceptor configuring the photoelectric conversion layer 72 and is dissociated to an electron and a hole. Charges generated here (the electron and the hole) are respectively carried to different electrodes by diffusion resulting from a carrier concentration difference and an internal electric field caused by a difference between work functions of a positive pole and a negative pole and are detected as an optical current. For example, the charges carried to the lower electrode 71 are transferred to and accumulated in the floating diffusion FD formed on the surface S1 of the semiconductor substrate 10 via a through electrode TSV.

In this way, the photoelectric conversion unit configuring the imaging unit 110 may be the organic photoelectric conversion unit 70 that includes not only the photodiode PD formed on the semiconductor substrate 10 but also an organic layer (the photoelectric conversion layer 72) formed outside (for example, light entrance direction) the semiconductor substrate 10 by using an organic material, for example.

Moreover, the imaging unit 110 may configure a so-called vertical spectroscopic imaging unit, for example, by providing two photoelectric conversion units (inorganic photoelectric conversion units) in a depth direction of the semiconductor substrate 10 and combining the two photoelectric conversion units with the organic photoelectric conversion unit 70. With this, it is possible for the imaging unit 110 to acquire a plurality of kinds of color signals by a single pixel P without using a color filter. Furthermore, in FIG. 23, an example is illustrated in which the organic photoelectric conversion unit 70 is provided on the surface (the surface S1) side of the semiconductor substrate 10. However, for example, it is possible to dispose the organic photoelectric conversion unit 70 on the rear surface (the surface S2) side of the semiconductor substrate 10 by using a through-via that passes through the semiconductor substrate 10 and the like.

5. Application Example

Application Example 1

Figure 24:
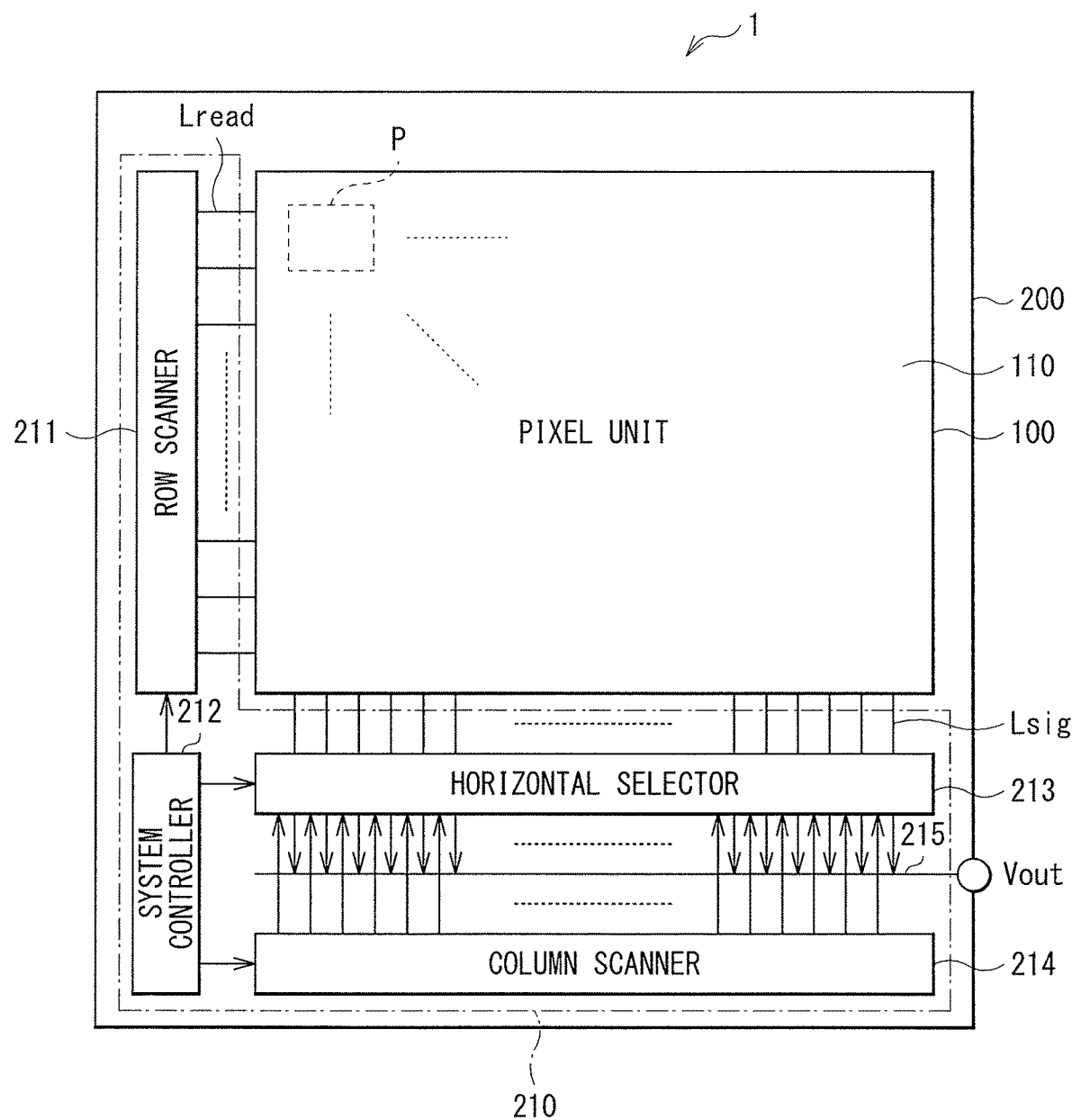

FIG. 24 illustrates an overall configuration of the imaging device (for example, the imaging device 1) described in the foregoing first embodiment and the like, for example. The imaging device 1 is, for example, a CMOS image sensor. The imaging device 1 includes the imaging unit 110 as an imaging region on the first substrate 100 and includes a peripheral circuit 210 including, for example, a row scanner 211, a horizontal selector 213, a column scanner 214, and a system controller 212 on the second substrate 200.

The imaging unit 110 includes, for example, a plurality of unit pixels P (for example, corresponding to the imaging device 1) two-dimensionally arranged in a matrix. For example, in the unit pixel P, a pixel driving line Lread (specifically, a row selection line and a reset control line) is wired for each pixel row, and a vertical signal line Lsig is wired for each pixel column. The pixel driving line Lread transmits a driving signal used to read a signal from the pixel. One end of the pixel driving line Lread is coupled to an output end corresponding to each row of the row scanner 211.

The row scanner 211 is a pixel driver that includes a shift register, an address decoder, and the like and drives each unit pixel P of the imaging unit 110, for example, in units of row.

A signal outputted from each unit pixel P of a pixel row that is selectively scanned by the row scanner 211 is supplied to the horizontal selector 213 via each vertical signal line Lsig. The horizontal selector 213 includes an amplifier, a horizontal selection switch, and the like provided for each vertical signal line Lsig.

The column scanner 214 includes a shift register, an address decoder, and the like and drives the horizontal selection switches of the horizontal selector 213 in order while scanning the horizontal selection switches. By performing the selective scanning by the column scanner 214, the signals of the respective pixels transmitted through the respective vertical signal lines Lsig are outputted to a horizontal signal line 215 in order and are transmitted to the second substrate 200 through the horizontal signal line 215.

A circuit portion including the row scanner 211, the horizontal selector 213, the column scanner 214, and the horizontal signal line 215 may be formed on the second substrate 200 or may be disposed on an external control IC. Furthermore, the circuit portion thereof may be formed on another substrate coupled by a cable and the like.

The system controller 212 receives a clock given from outside of the first substrate 100, data that instructs an operation mode, and the like and outputs data of inside information of the imaging device 1 and the like. The system controller 212 further includes a timing generator that generates various timing signals and drives and controls the peripheral circuit such as the row scanner 211, the horizontal selector 213, or the column scanner 214 on the basis of the various timing signals generated by the timing generator.

Application Example 2

Figure 25:
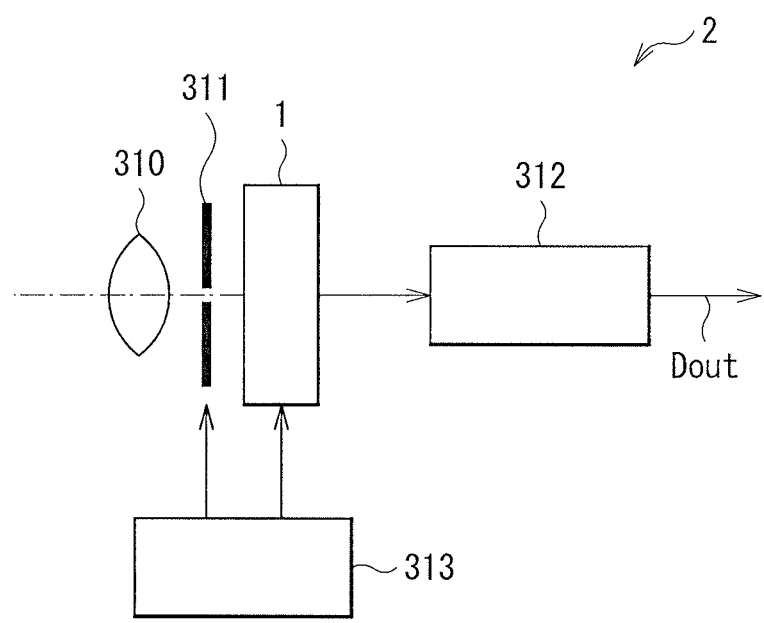

It is possible to apply the imaging device 1 described above (or the imaging devices 1A to 1D) to any type of electronic apparatus having an imaging function, for example, a camera system such as a digital still camera or a video camera, a mobile phone having an imaging function, or the like. FIG. 25 illustrates a schematic configuration of a camera 2 as an example of the electronic apparatus. The camera 2 is, for example, a video camera that is able to capture a still image or a moving image and includes the imaging device 1, the optical system (an optical lens) 310, a shutter device 311, a driver 313 that drives the imaging device 1 and the shutter device 311, and a signal processor 312.

The optical system 310 guides image light (entering light) from a subject to the imaging unit 110 of the imaging device 1. This optical system 310 may include a plurality of optical lenses. The shutter device 311 controls a period in which the imaging device 1 is irradiated with light and a light shielding period. The driver 313 controls a transfer operation of the imaging device 1 and a shutter operation of the shutter device 311. The signal processor 312 executes various signal processes on a signal outputted from the imaging device 1. A signal-processed video signal Dout is stored in a storage medium such as a memory or is outputted to a monitor and the like.

6. Applied Examples (Applied Example to In-Vivo Information Acquisition System)

Moreover, it is possible to apply the technology (the present technology) according to the present disclosure to various products. For example, the technology according to the present disclosure may be applied to an endoscopic surgery system.

Figure 26:
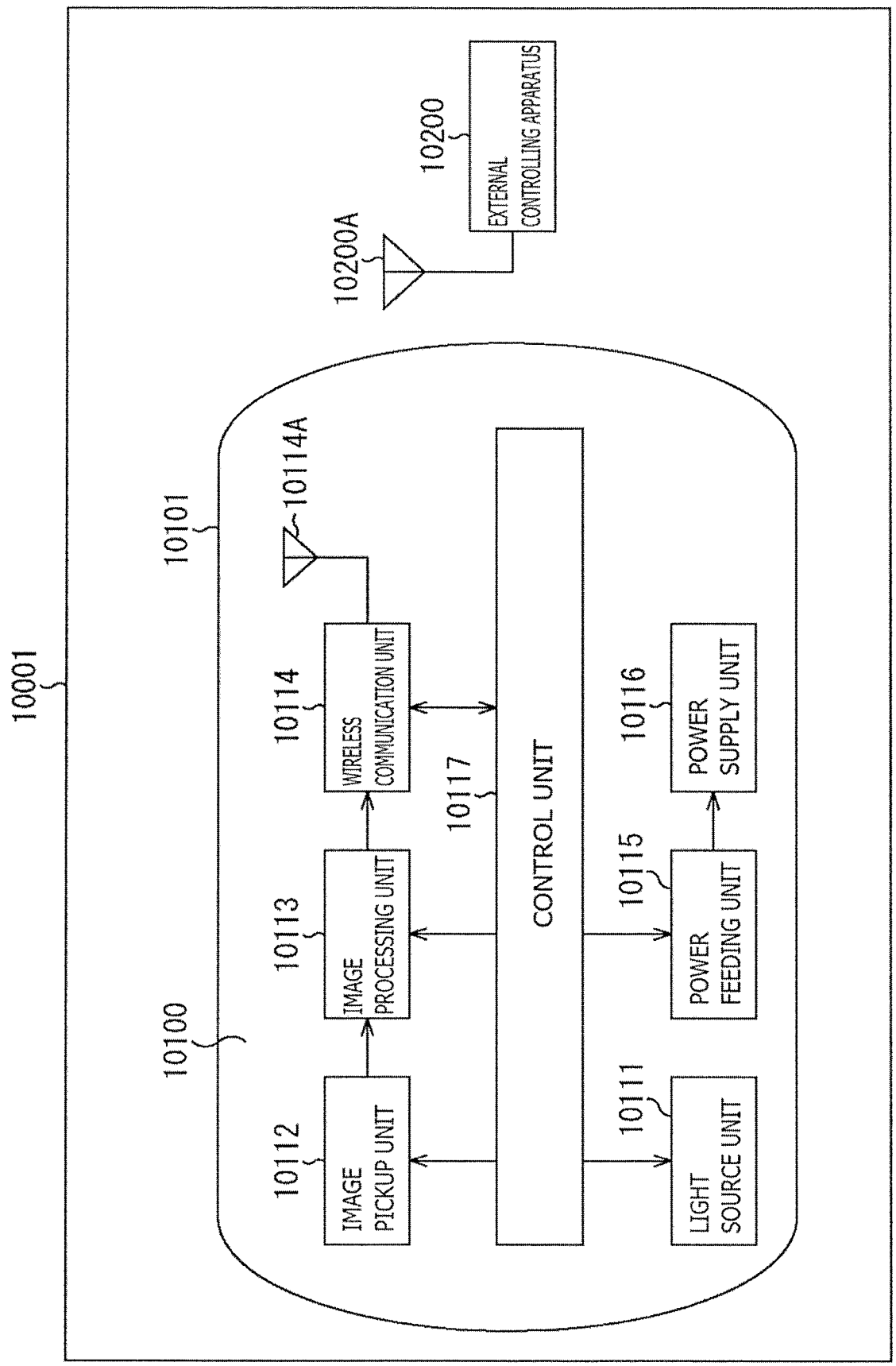
FIG. 26 is a block diagram depicting an example of a schematic configuration of an in-vivo information acquisition system.

FIG. 26 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 26, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or an image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure can be applied has been described above. The technology according to the present disclosure can be applied to, for example, the imaging unit 10112 of the configuration described above. As a result, detection accuracy is improved.

(Applied Example to Endoscopic Surgery System)

It is possible to apply the technology (the present technology) according to the present disclosure to various products. For example, the technology according to the present disclosure may be applied to an endoscopic surgery system.

Figure 27:
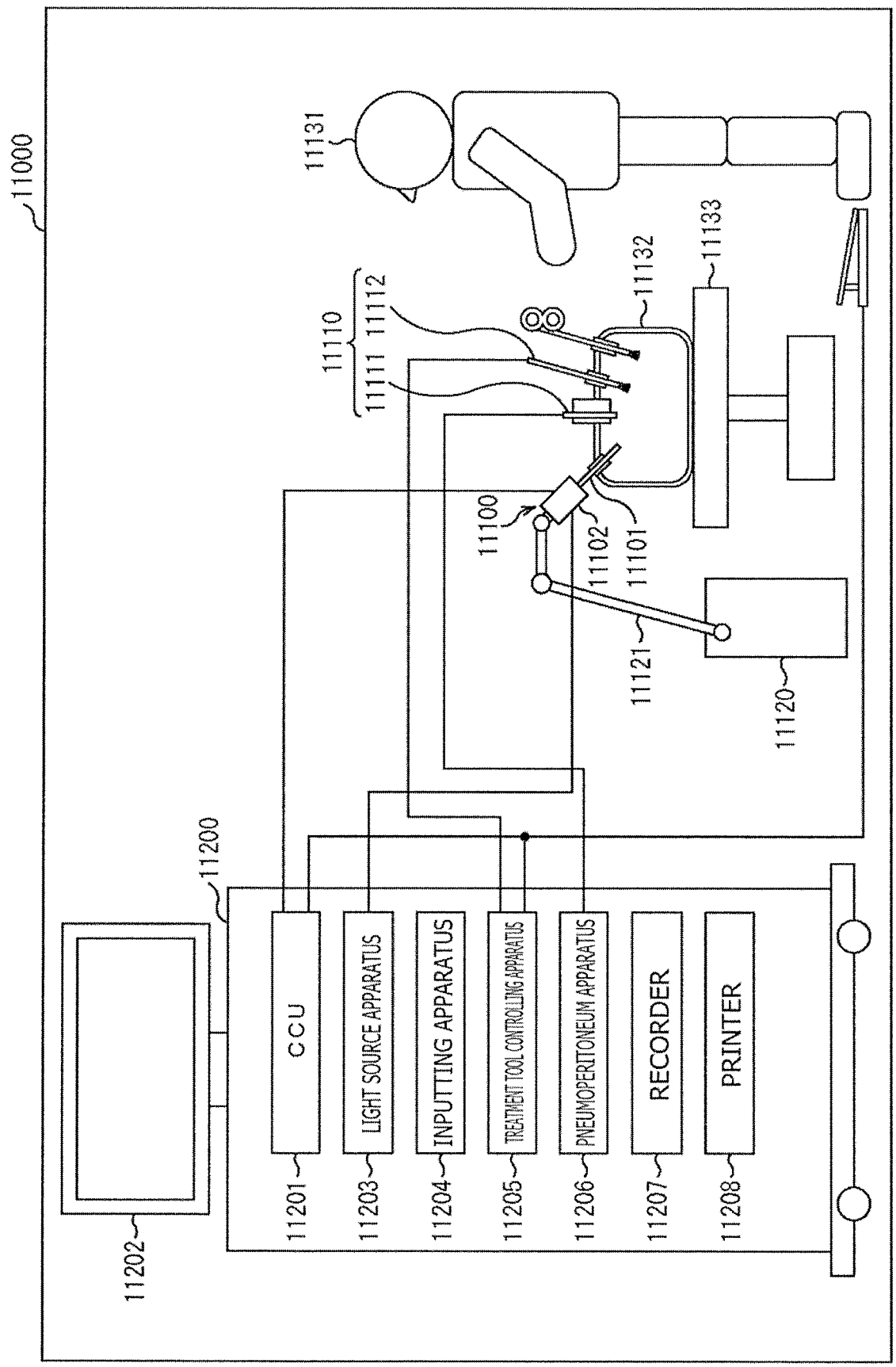
FIG. 27 is a view depicting an example of a schematic configuration of an endoscopic surgery system.

FIG. 27 is a view depicting an example of a schematic configuration of an endoscopic surgery system to which the technology according to an embodiment of the present disclosure (present technology) can be applied.

In FIG. 27, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as, a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 28:
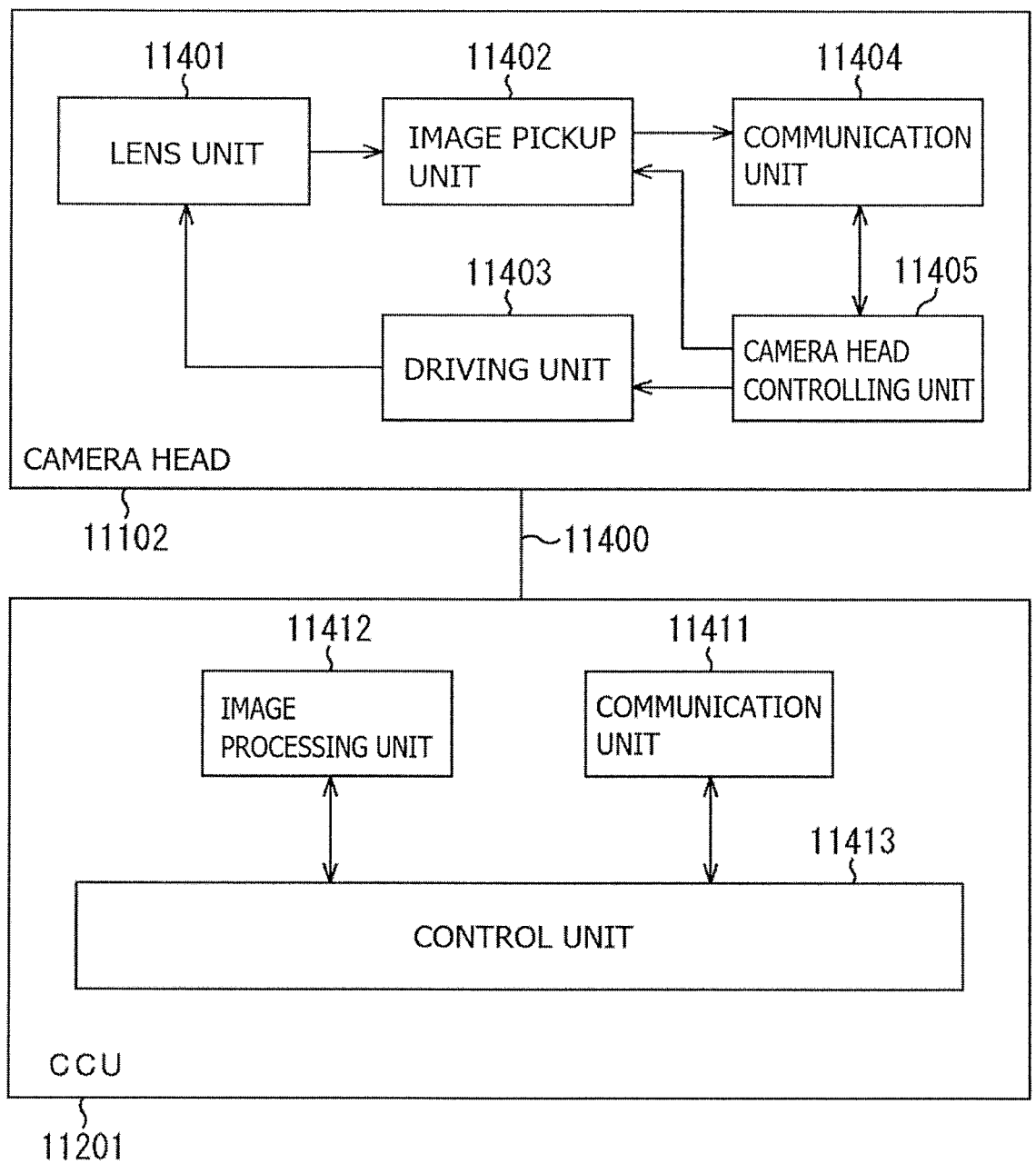
FIG. 28 is a block diagram depicting an example of a functional configuration of a camera head and a camera control unit (CCU).

FIG. 28 is a block diagram depicting an example of a functional configuration of the camera head 11102 and the CCU 11201 depicted in FIG. 27.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the imaging unit 11402 of the configuration described above. By applying the technology according to the present disclosure to the imaging unit 11402, detection accuracy is improved.

Note that, here, the endoscopic surgery system has been described as an example. However, in addition, the technology according to the present disclosure may be applied to, for example, a microscopic surgery system and the like.

(Applied Example to Movable Body)

It is possible to apply the technology according to the present disclosure to various products. For example, the technology according to the present disclosure may be implemented as a device mounted on a movable body of any kind of such as an automobile, an electric vehicle, a hybrid electric vehicle, a motorcycle, a bicycle, a personal mobility, an airplane, a drone, a vessel, a robot, a construction machine, an agricultural machine, and the like.

Figure 29:
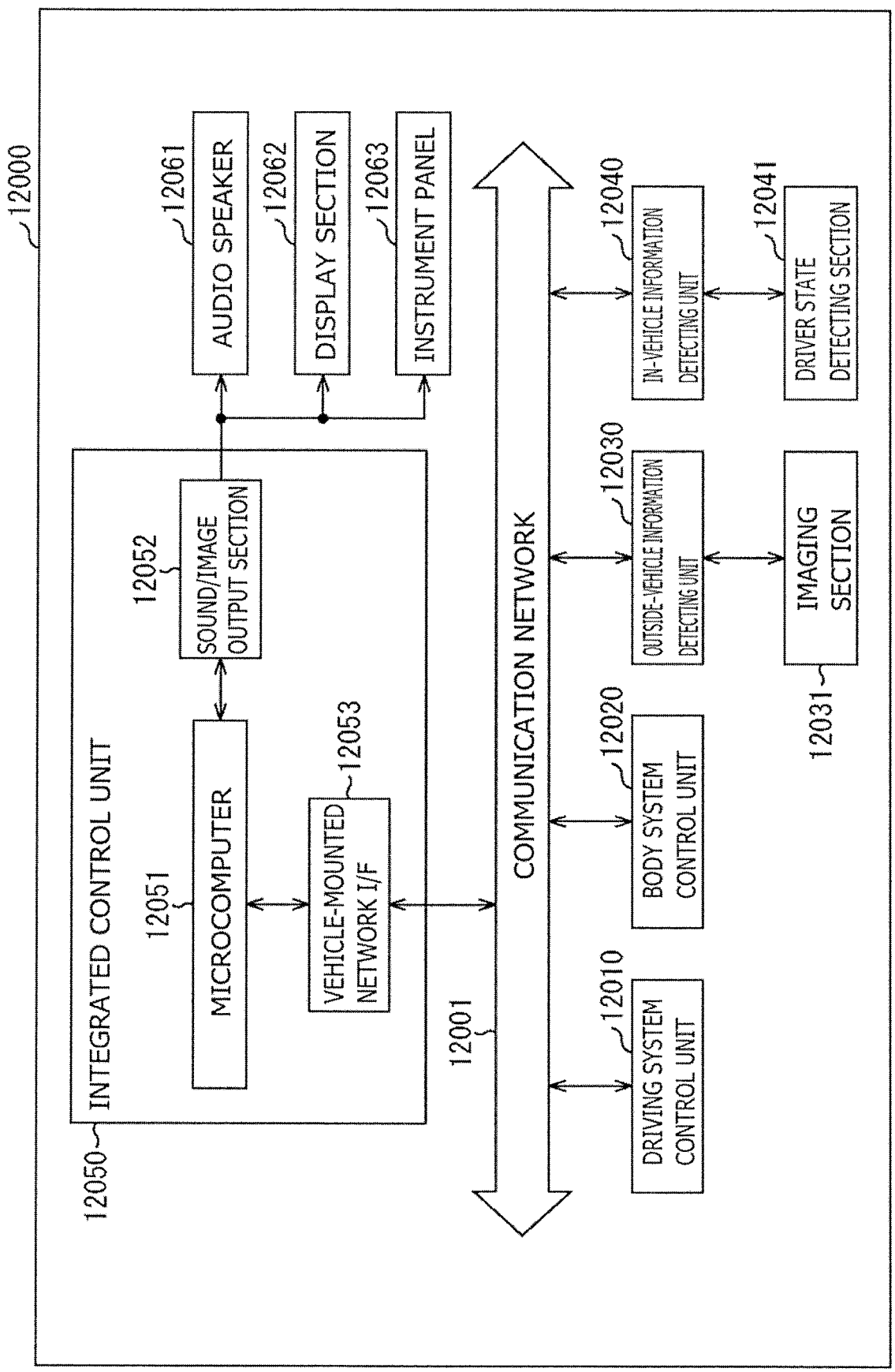
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
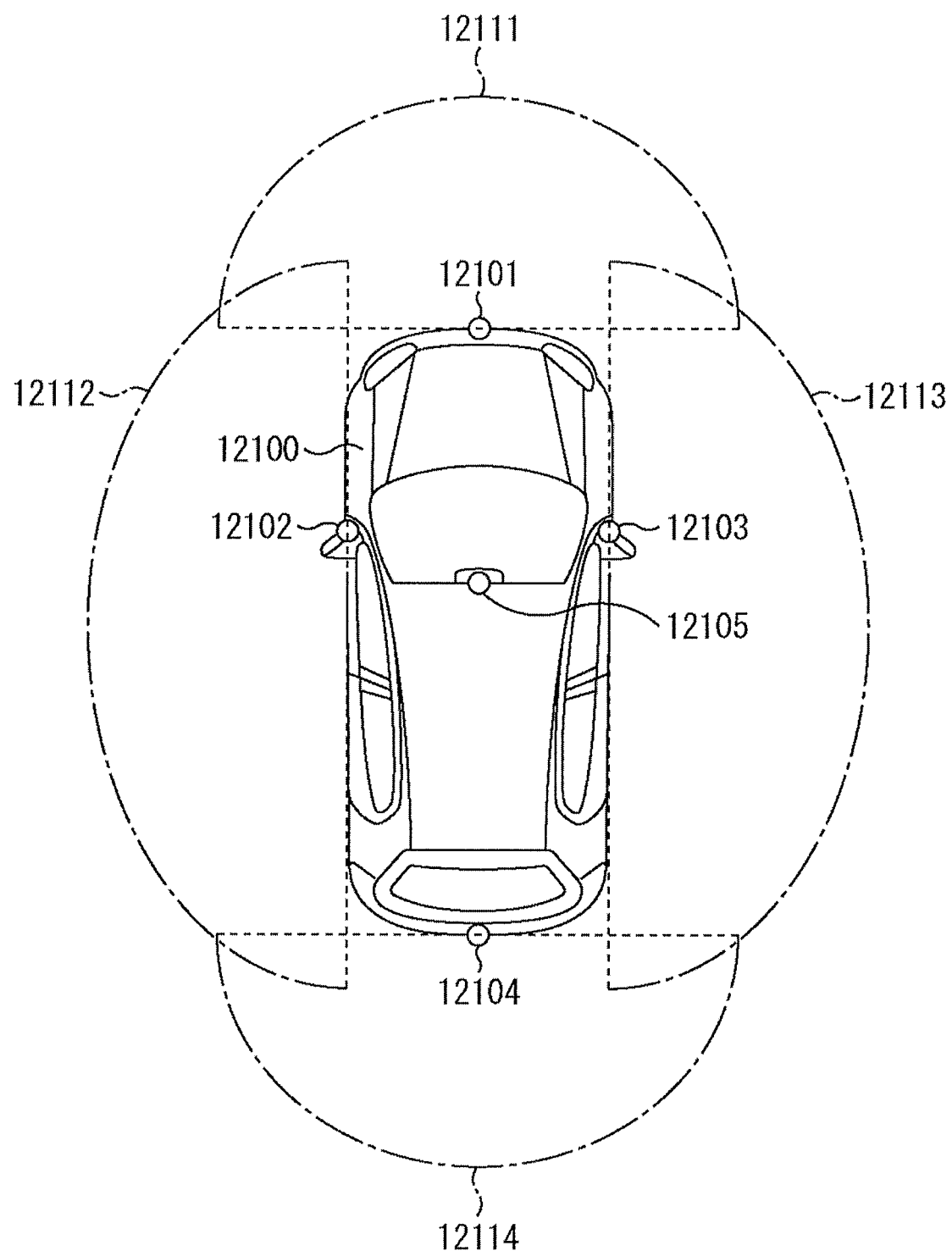
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The first to the third embodiments, the modification examples 1 to 4, the application examples, and the applied examples have been described above. However, the content of the present disclosure is not limited to the embodiments described above and the like, and it is possible to variously modify the content of the present disclosure. For example, it is not necessary to include all the components described above in the embodiments and the like, and in addition, other components may be included.

Furthermore, in FIG. 4 and the like, a configuration in which 2×2 pixels are shared is illustrated as a specific example of the pixel configuration of the imaging unit 110. However, the pixel configuration is not limited to this and may be, for example, a configuration in which 1×2 pixels are shared or 2×4 pixels are shared.

Note that effects described herein are not necessarily limited and any effect described in the present disclosure may be provided.

Note that it is possible for the present disclosure to have the following configurations. According to the present technology having the following configurations, it is possible to configure an imaging device including an electric power generating unit without reducing the number and an area of sensor pixels configuring an imaging unit or without increasing an area of a semiconductor substrate. Therefore, it is possible to provide an imaging device that has both excellent pixel characteristics and a great power generation amount.

(1)

An imaging device including:

a semiconductor substrate including one surface and another surface that are opposed to each other;

an imaging unit that is provided in the semiconductor substrate and includes a plurality of sensor pixels that performs photoelectric conversion; and an electric power generating unit that is provided around the imaging unit of the semiconductor substrate and performs photoelectric conversion.

(2)

The imaging device according to (1) described above, in which an optical system is disposed above the one surface of the semiconductor substrate, and the imaging unit and the electric power generating unit are disposed in an image circle of the optical system.

(3)

The imaging device according to (1) or (2) described above, in which the imaging unit and the electric power generating unit are electrically isolated from each other.

(4)

The imaging device according to any one of (1) to (3) described above, in which the semiconductor substrate further includes an isolator between the imaging unit and the electric power generating unit, and the imaging unit and the electric power generating unit are electrically isolated from each other by the isolator.

(5)

The imaging device according to (4) described above, in which the isolator is formed by an insulation film or an impurity region.

(6)

The imaging device according to (4) or (5) described above, in which the isolator passes through between the one surface and the other surface of the semiconductor substrate.

(7)

The imaging device according to (4) or (5) described above, in which the isolator is formed from the other surface toward the one surface of the semiconductor substrate and extends in an in-plane direction of the semiconductor substrate inside the semiconductor substrate.

(8)

The imaging device according to any one of (5) to (7) described above, in which a fixed potential is applied to the impurity region configuring the isolator.

(9)

The imaging device according to any one of (1) to (8) described above, in which the semiconductor substrate includes a first conductivity type region and a second conductivity type region that is provided in the first conductivity type region and has a conductivity type different from that of the first conductivity type region, the first conductivity type region and the second conductivity type region forming a p-n junction.

(10)

The imaging device according to (9) described above, in which, in the imaging unit, the second conductivity type region is formed for each of the sensor pixels and in the first conductivity type region that extends across an entire surface.

(11)

The imaging device according to (9) or (10) described above, in which, in the electric power generating unit, the second conductivity type region is formed in a comb-like shape in the first conductivity type region that extends across an entire surface.

(12)

The imaging device according to (9) or (10) described above, in which, in the electric power generating unit, the second conductivity type region is formed in a dot-like shape in the first conductivity type region that extends across an entire surface.

(13)

The imaging device according to any one of (9) to (12) described above, in which, in the electric power generating unit, a plurality of the second conductivity type regions that extends in an in-plane direction of the semiconductor substrate is laminated with the first conductivity type region interposed in between.

(14)

The imaging device according to any one of (1) to (13) described above, in which the electric power generating unit extends from surrounding of the imaging unit in the other surface of the semiconductor substrate and partially has a laminated structure with the imaging unit.

(15)

The imaging device according to any one of (1) to (14) described above, in which the semiconductor substrate has an uneven shape on the one surface.

(16)

The imaging device according to any one of (1) to (15) described above, in which the imaging unit has an approximately-rectangular shape and includes a dummy pixel on at least one side of a periphery.

(17)

The imaging device according to any one of (1) to (16) described above, in which the imaging unit further includes an organic photoelectric conversion unit outside the semiconductor substrate, the organic photoelectric conversion unit including an organic material.

What is claimed is:

1. An imaging device, comprising:
   a semiconductor substrate including one surface and another surface that are opposed to each other;
   an imaging unit that is provided in the semiconductor substrate and includes a plurality of sensor pixels that performs photoelectric conversion; and
   an electric power generating unit that is provided to surround a periphery of the imaging unit of the semiconductor substrate in a plan view and performs photoelectric conversion.

2. The imaging device according to claim 1, wherein
   an optical system is disposed above the one surface of the semiconductor substrate, and
   the imaging unit and the electric power generating unit are disposed in an image circle of the optical system.

3. The imaging device according to claim 1, wherein the imaging unit and the electric power generating unit are electrically isolated from each other.

4. The imaging device according to claim 1, wherein
   the semiconductor substrate further includes an isolator between the imaging unit and the electric power generating unit, and
   the imaging unit and the electric power generating unit are electrically isolated from each other by the isolator.

5. The imaging device according to claim 4, wherein the isolator is formed by an insulation film or an impurity region.

6. The imaging device according to claim 4, wherein the isolator passes through between the one surface and the other surface of the semiconductor substrate.

7. The imaging device according to claim 4, wherein the isolator is formed from the other surface toward the one surface of the semiconductor substrate and extends in an in-plane direction of the semiconductor substrate inside the semiconductor substrate.

8. The imaging device according to claim 1, wherein the semiconductor substrate includes a first conductivity type region and a second conductivity type region that is provided in the first conductivity type region and has a conductivity type different from that of the first conductivity type region, the first conductivity type region and the second conductivity type region forming a p-n junction.

9. The imaging device according to claim 8, wherein, in the imaging unit, the second conductivity type region is formed for each of the sensor pixels and in the first conductivity type region that extends across an entire surface.

10. The imaging device according to claim 8, wherein, in the electric power generating unit, the second conductivity type region is formed in a comb-like shape in the first conductivity type region that extends across an entire surface.

11. The imaging device according to claim 8, wherein, in the electric power generating unit, the second conductivity type region is formed in a dot-like shape in the first conductivity type region that extends across an entire surface.

12. The imaging device according to claim 8, wherein, in the electric power generating unit, a plurality of the second conductivity type regions that extends in an in-plane direction of the semiconductor substrate is laminated with the first conductivity type region interposed in between.

13. The imaging device according to claim 1, wherein the electric power generating unit extends from surrounding of the imaging unit in the other surface of the semiconductor substrate and partially has a laminated structure with the imaging unit.

14. The imaging device according to claim 1, wherein the semiconductor substrate has an uneven shape on the one surface.

15. The imaging device according to claim 1, wherein the imaging unit has a rectangular shape and includes a dummy pixel on at least one side of the imaging unit.

16. The imaging device according to claim 1, wherein the imaging unit further includes an organic photoelectric conversion unit outside the semiconductor substrate, the organic photoelectric conversion unit including an organic material.

17. The imaging device according to claim 1, further comprising an optical black region that is provided to surround a periphery of the imaging unit of the semiconductor substrate in a plan view.

18. The imaging device according to claim 1, wherein the optical black region is provided between the imaging unit and the electric power generating unit.

19. The imaging device according to claim 4, further comprising a contact region provided between the imaging unit and the isolator.

20. An imaging device, comprising:
- a semiconductor substrate including one surface and another surface that are opposed to each other;
- an imaging unit that is provided in the semiconductor substrate and includes a plurality of sensor pixels that performs photoelectric conversion; and
- an electric power generating unit that is provided to surround a periphery of the imaging unit of the semiconductor substrate in a plan view and performs photoelectric conversion,
- wherein the electric power generating unit includes at least one solar cell.

\* \* \* \* \*